US011450529B2

(12) United States Patent
Longrie et al.

(10) Patent No.: US 11,450,529 B2
(45) Date of Patent: Sep. 20, 2022

(54) METHODS FOR SELECTIVELY FORMING A TARGET FILM ON A SUBSTRATE COMPRISING A FIRST DIELECTRIC SURFACE AND A SECOND METALLIC SURFACE

(71) Applicant: ASM IP Holding B.V., Almere (NL)

(72) Inventors: Delphine Longrie, Ghent (BE); Shaoren Deng, Leuven (BE); Jan Willem Maes, Wilrijk (BE)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/096,444

(22) Filed: Nov. 12, 2020

(65) Prior Publication Data

US 2021/0159077 A1 May 27, 2021

Related U.S. Application Data

(60) Provisional application No. 62/940,705, filed on Nov. 26, 2019.

(51) Int. Cl.
*H01L 21/02* (2006.01)
*H01L 21/027* (2006.01)
*H01L 21/3213* (2006.01)

(52) U.S. Cl.
CPC .... *H01L 21/02636* (2013.01); *H01L 21/0262* (2013.01); *H01L 21/0273* (2013.01); *H01L 21/32136* (2013.01); *H01L 21/32139* (2013.01)

(58) Field of Classification Search
CPC .......... H01L 21/02636; H01L 21/0262; H01L 21/0273; H01L 21/32136; H01L 21/32139; H01L 21/32

USPC ........................................................ 257/288
See application file for complete search history.

(56) References Cited

U.S. PATENT DOCUMENTS

| | | | |
|---|---|---|---|
| 3,197,682 A | 7/1965 | Klass et al. | |
| 3,634,740 A | 1/1972 | Stevko | |
| 3,916,270 A | 10/1975 | Wachtler et al. | |
| 3,983,401 A | 9/1976 | Livesay | |
| 4,099,041 A | 7/1978 | Berkman et al. | |
| 4,184,188 A | 1/1980 | Briglia | |

(Continued)

FOREIGN PATENT DOCUMENTS

| | | |
|---|---|---|
| CN | 101047143 | 10/2007 |
| CN | 101308794 | 9/2010 |

(Continued)

OTHER PUBLICATIONS

CNIPA; Notice of Allowance dated Dec. 21, 2020 in Application No. 201610982040.X.

(Continued)

*Primary Examiner* — Quoc D Hoang
(74) *Attorney, Agent, or Firm* — Snell & Wilmer L.L.P.

(57) ABSTRACT

Methods for selectively forming a target film on a substrate comprising a first dielectric surface and a second metallic surface are disclosed. The methods may include: contacting the substrate with a plasma generated from a hydrogen containing gas, selectively forming a passivation film from vapor phase reactants on the first dielectric surface while leaving the second metallic surface free from the passivation film, and selectively depositing the target film from vapor phase reactants on the second metallic surface relative to the passivation film.

19 Claims, 5 Drawing Sheets

(56) References Cited

U.S. PATENT DOCUMENTS

| | | |
|---|---|---|
| 4,241,000 A | 12/1980 | McCauley et al. |
| 4,384,918 A | 5/1983 | Abe |
| 4,412,133 A | 10/1983 | Eckes et al. |
| 4,480,284 A | 10/1984 | Tojo et al. |
| 4,481,300 A | 11/1984 | Hartnett et al. |
| 4,496,828 A | 1/1985 | Kusmierz et al. |
| 4,502,094 A | 2/1985 | Lewin et al. |
| 4,520,116 A | 5/1985 | Gentilman et al. |
| 4,520,421 A | 5/1985 | Sakitani et al. |
| 4,534,816 A | 8/1985 | Chen et al. |
| 4,535,628 A | 8/1985 | Hope |
| 4,551,192 A | 11/1985 | Di Milia et al. |
| 4,554,611 A | 11/1985 | Lewin |
| 4,700,089 A | 10/1987 | Fujii et al. |
| 4,720,362 A | 1/1988 | Gentilman et al. |
| 4,804,086 A | 2/1989 | Grohrock |
| 4,880,982 A | 11/1989 | Hoksaas |
| 4,886,162 A | 12/1989 | Ambrogio |
| 4,931,135 A | 6/1990 | Horiuchi et al. |
| 4,938,815 A | 7/1990 | McNeilly |
| 4,949,671 A | 8/1990 | Davis et al. |
| 4,956,538 A | 9/1990 | Moslehi |
| 4,963,506 A | 10/1990 | Liaw et al. |
| 5,117,121 A | 5/1992 | Watanabe et al. |
| 5,124,272 A | 6/1992 | Saito et al. |
| 5,125,710 A | 6/1992 | Gianelo |
| 5,186,120 A | 2/1993 | Ohnishi et al. |
| D333,606 S | 3/1993 | Kanemitsu et al. |
| 5,208,961 A | 5/1993 | Lajoie |
| 5,219,226 A | 6/1993 | James |
| 5,231,062 A | 7/1993 | Mathers et al. |
| 5,242,501 A | 9/1993 | McDiarmid |
| 5,250,092 A | 10/1993 | Nakano |
| 5,252,133 A | 10/1993 | Miyazaki et al. |
| 5,252,134 A | 10/1993 | Stauffer |
| 5,280,894 A | 1/1994 | Witcraft et al. |
| 5,295,777 A | 3/1994 | Hodos |
| 5,298,089 A | 3/1994 | Bowe et al. |
| 5,308,788 A | 5/1994 | Fitch et al. |
| 5,310,410 A | 5/1994 | Begin et al. |
| 5,328,360 A | 7/1994 | Yokokawa |
| 5,362,328 A | 11/1994 | Gardiner et al. |
| 5,378,501 A | 1/1995 | Foster et al. |
| 5,456,757 A | 10/1995 | Aruga et al. |
| 5,478,429 A | 12/1995 | Komino et al. |
| 5,518,780 A | 5/1996 | Tamor et al. |
| 5,540,821 A | 7/1996 | Tepman |
| 5,565,038 A | 10/1996 | Ashley |
| 5,584,936 A | 12/1996 | Pickering et al. |
| 5,584,963 A | 12/1996 | Takahashi |
| 5,637,153 A | 6/1997 | Niino et al. |
| 5,645,646 A | 7/1997 | Beinglass et al. |
| 5,661,263 A | 8/1997 | Salvaggio |
| 5,683,561 A | 11/1997 | Hollars et al. |
| 5,690,742 A | 11/1997 | Ogata et al. |
| 5,732,957 A | 3/1998 | Yu |
| 5,804,505 A | 9/1998 | Yamada et al. |
| 5,851,293 A | 12/1998 | Lane et al. |
| D403,949 S | 1/1999 | Nakamura |
| 5,855,687 A | 1/1999 | DuBois et al. |
| 5,871,586 A | 2/1999 | Crawley et al. |
| 5,888,304 A | 3/1999 | Umotoy et al. |
| 5,897,710 A | 4/1999 | Sato et al. |
| 5,915,200 A | 6/1999 | Tokumasu et al. |
| 5,976,973 A | 11/1999 | Ohira et al. |
| 6,022,180 A | 2/2000 | Motoyama et al. |
| 6,022,802 A | 2/2000 | Jang |
| 6,025,117 A | 2/2000 | Nakano et al. |
| 6,033,215 A | 3/2000 | Ohsawa |
| 6,090,442 A | 7/2000 | Klaus et al. |
| 6,093,611 A | 7/2000 | Gardner et al. |
| 6,099,651 A | 8/2000 | Sajoto et al. |
| 6,139,983 A | 10/2000 | Ohashi et al. |
| 6,143,129 A | 11/2000 | Savas et al. |
| 6,152,669 A | 11/2000 | Morita et al. |
| 6,159,301 A | 12/2000 | Sato et al. |
| 6,176,929 B1 | 1/2001 | Fukunaga et al. |
| 6,177,688 B1 | 1/2001 | Linthicum et al. |
| 6,189,482 B1 | 2/2001 | Zhao et al. |
| 6,217,662 B1 | 4/2001 | Kong et al. |
| 6,224,679 B1 | 5/2001 | Sasaki et al. |
| 6,235,121 B1 | 5/2001 | Honma et al. |
| 6,239,402 B1 | 5/2001 | Araki et al. |
| 6,239,715 B1 | 5/2001 | Belton |
| 6,245,647 B1 | 6/2001 | Akiyama et al. |
| 6,255,221 B1 | 7/2001 | Hudson et al. |
| 6,271,320 B1 | 8/2001 | Keller et al. |
| 6,328,864 B1 | 12/2001 | Ishizawa et al. |
| 6,335,293 B1 | 1/2002 | Luo et al. |
| 6,387,823 B1 | 5/2002 | Sonderman et al. |
| 6,452,017 B1 | 9/2002 | Uhlenbrock et al. |
| 6,462,310 B1 | 10/2002 | Ratliff et al. |
| 6,464,825 B1 | 10/2002 | Shinozaki |
| 6,474,987 B1 | 11/2002 | Huang et al. |
| 6,475,902 B1 | 11/2002 | Hausmann et al. |
| 6,596,398 B1 | 7/2003 | Russo et al. |
| 6,617,253 B1 | 9/2003 | Chu et al. |
| 6,623,799 B1 | 9/2003 | Lee et al. |
| 6,658,933 B2 | 12/2003 | Allegre et al. |
| 6,659,111 B1 | 12/2003 | Mouri et al. |
| 6,676,759 B1 | 1/2004 | Takagi |
| 6,692,903 B2 | 2/2004 | Chen et al. |
| 6,712,949 B2 | 3/2004 | Gopal |
| 6,716,477 B1 | 4/2004 | Komiyama et al. |
| 6,720,262 B2 | 4/2004 | Koh et al. |
| 6,766,545 B2 | 7/2004 | Hodges |
| 6,776,849 B2 | 8/2004 | Aggarwal et al. |
| D497,536 S | 10/2004 | Fujiwara |
| 6,818,566 B2 | 11/2004 | Leeson et al. |
| 6,821,889 B2 | 11/2004 | Elers et al. |
| 6,825,106 B1 | 11/2004 | Gao et al. |
| 6,843,858 B2 | 1/2005 | Rossman |
| 6,849,241 B2 | 2/2005 | Dauelsberg et al. |
| 6,854,580 B2 | 2/2005 | Braford |
| 6,867,086 B1 | 3/2005 | Chen et al. |
| 6,867,153 B2 | 3/2005 | Tokunaga |
| 6,902,647 B2 | 6/2005 | Hasper |
| RE38,937 E | 1/2006 | Nakamura |
| D524,600 S | 7/2006 | Austin et al. |
| D525,127 S | 7/2006 | Cogley et al. |
| 7,122,844 B2 | 10/2006 | Nakamura et al. |
| 7,144,806 B1 | 12/2006 | Fair et al. |
| D535,673 S | 1/2007 | Conway et al. |
| 7,229,502 B2 | 6/2007 | Wang et al. |
| D549,815 S | 8/2007 | Murphy |
| 7,297,641 B2 | 11/2007 | Todd et al. |
| 7,311,977 B2 | 12/2007 | Yokota et al. |
| D562,357 S | 2/2008 | Hardy |
| 7,354,482 B2 | 4/2008 | Konishi et al. |
| 7,662,689 B2 | 2/2010 | Boyanov et al. |
| D614,258 S | 4/2010 | Kojima |
| 7,727,880 B1 | 6/2010 | Chattopadhyay et al. |
| 7,858,898 B2 | 12/2010 | Bailey et al. |
| D633,452 S | 3/2011 | Namiki et al. |
| 7,910,452 B2 | 3/2011 | Roh et al. |
| 8,128,333 B2 | 3/2012 | Aburatani |
| 8,174,400 B2 | 5/2012 | Park et al. |
| 8,253,204 B2 | 8/2012 | Lee et al. |
| 8,278,224 B1 | 10/2012 | Mui et al. |
| 8,318,584 B2 | 11/2012 | Li et al. |
| 8,404,044 B2 | 3/2013 | Arai |
| 8,435,894 B2 | 5/2013 | Chandrashekar et al. |
| 8,443,484 B2 | 5/2013 | Ozaki et al. |
| 8,507,720 B2 | 8/2013 | Shay |
| D693,782 S | 11/2013 | Mori et al. |
| 8,637,384 B2 | 1/2014 | Ando et al. |
| 8,784,676 B2 | 7/2014 | Guha et al. |
| 8,895,395 B1 | 11/2014 | Kerber et al. |
| 8,937,800 B2 | 1/2015 | Lubomirsky et al. |
| 8,968,989 B2 | 3/2015 | Ouattara et al. |
| 8,969,934 B1 | 3/2015 | Cheng et al. |
| 8,993,072 B2 | 3/2015 | Xiao et al. |
| 9,214,340 B2 | 12/2015 | Kurita et al. |
| 9,281,223 B2 | 3/2016 | Hara |

(56) References Cited

U.S. PATENT DOCUMENTS

| | | |
|---|---|---|
| 9,337,031 B2 | 5/2016 | Kim et al. |
| D759,193 S | 6/2016 | Gutierrez et al. |
| D761,325 S | 7/2016 | Abed |
| 9,428,833 B1 | 8/2016 | Duvall et al. |
| 9,449,843 B1 | 9/2016 | Korolik et al. |
| 9,449,987 B1 | 9/2016 | Miyata et al. |
| 9,460,954 B2 | 10/2016 | De Jong et al. |
| 9,472,410 B2 | 10/2016 | Sadjadi et al. |
| 9,605,736 B1 | 3/2017 | Foshage et al. |
| D784,276 S | 4/2017 | Tiner et al. |
| 9,618,846 B2 | 4/2017 | Shamma et al. |
| 9,653,267 B2 | 5/2017 | Carducci et al. |
| D793,526 S | 8/2017 | Behdjat |
| D794,753 S | 8/2017 | Miller |
| 9,748,104 B2 | 8/2017 | Sasaki et al. |
| D797,067 S | 9/2017 | Zhang et al. |
| D798,248 S | 9/2017 | Hanson et al. |
| D800,782 S | 10/2017 | Bever et al. |
| 9,803,926 B2 | 10/2017 | Kikuchi et al. |
| D801,942 S | 11/2017 | Riker et al. |
| D802,472 S | 11/2017 | Sasaki et al. |
| D803,802 S | 11/2017 | Sasaki et al. |
| 9,812,372 B2 | 11/2017 | Choi et al. |
| 9,824,881 B2 | 11/2017 | Niskanen et al. |
| 9,837,355 B2 | 12/2017 | Briggs et al. |
| 9,842,835 B1 | 12/2017 | Cheng et al. |
| 9,847,247 B2 | 12/2017 | Huang et al. |
| 9,850,573 B1 | 12/2017 | Sun |
| D807,494 S | 1/2018 | Kim et al. |
| 9,911,595 B1 | 3/2018 | Smith et al. |
| 9,929,055 B2 | 3/2018 | Dube et al. |
| 9,970,112 B2 | 5/2018 | Koshi et al. |
| D825,505 S | 8/2018 | Hanson et al. |
| D825,614 S | 8/2018 | Bever et al. |
| D829,306 S | 9/2018 | Ikedo et al. |
| D834,686 S | 11/2018 | Yamada et al. |
| 10,229,851 B2 | 3/2019 | Briggs et al. |
| 10,229,985 B1 | 3/2019 | Li et al. |
| D846,008 S | 4/2019 | Geldenhuys et al. |
| D849,055 S | 5/2019 | Kneip |
| 10,332,747 B1 | 6/2019 | Watanabe et al. |
| 10,361,366 B2 | 7/2019 | Hakamata et al. |
| 10,395,963 B2 | 8/2019 | Cooke |
| 10,424,476 B2 | 9/2019 | Suzuki et al. |
| 10,424,477 B2 | 9/2019 | Niskanen et al. |
| D864,134 S | 10/2019 | Watarai et al. |
| 10,510,529 B2 | 12/2019 | Suzuki et al. |
| 10,590,535 B2 | 3/2020 | Huggare |
| D881,338 S | 4/2020 | Chen |
| 10,622,236 B2 | 4/2020 | Kuo et al. |
| 10,662,525 B2 | 5/2020 | Jang et al. |
| 10,704,143 B1 | 7/2020 | Hisamitsu et al. |
| 10,731,249 B2 | 8/2020 | Hatanpää et al. |
| 10,734,497 B2 | 8/2020 | Zhu et al. |
| 10,741,386 B2 | 8/2020 | Chen et al. |
| 10,770,336 B2 | 9/2020 | Hill et al. |
| D913,980 S | 3/2021 | Lee et al. |
| D914,620 S | 3/2021 | Rokkam et al. |
| 10,950,477 B2 | 3/2021 | Lin et al. |
| 11,018,003 B2 | 5/2021 | Huang et al. |
| D922,229 S | 6/2021 | Jun et al. |
| 11,053,584 B2 | 7/2021 | Hsieh et al. |
| 2001/0003271 A1 | 6/2001 | Otsuki |
| 2001/0007244 A1 | 7/2001 | Matsuse |
| 2001/0019347 A1 | 9/2001 | Hauck |
| 2001/0022215 A1 | 9/2001 | Donohoe |
| 2001/0024387 A1 | 9/2001 | Raaijmakers et al. |
| 2001/0027585 A1 | 10/2001 | Lee |
| 2001/0042514 A1 | 11/2001 | Mizuno et al. |
| 2001/0052556 A1 | 12/2001 | Ting et al. |
| 2001/0054381 A1 | 12/2001 | Umotoy et al. |
| 2002/0015853 A1 | 2/2002 | Wataya et al. |
| 2002/0022347 A1 | 2/2002 | Park et al. |
| 2002/0033183 A1 | 3/2002 | Sun et al. |
| 2002/0036065 A1 | 3/2002 | Yamagishi et al. |
| 2002/0047705 A1 | 4/2002 | Tada et al. |
| 2002/0052119 A1 | 5/2002 | Cleemput |
| 2002/0061716 A1 | 5/2002 | Korovin et al. |
| 2002/0073923 A1 | 6/2002 | Saito et al. |
| 2002/0079056 A1 | 6/2002 | Kudo et al. |
| 2002/0106909 A1 | 8/2002 | Kato et al. |
| 2002/0108570 A1 | 8/2002 | Lindfors |
| 2002/0117262 A1 | 8/2002 | Pang et al. |
| 2002/0127956 A1 | 9/2002 | Ashjaee et al. |
| 2002/0129768 A1 | 9/2002 | Carpenter et al. |
| 2003/0008602 A1 | 1/2003 | Ashjaee et al. |
| 2003/0013314 A1 | 1/2003 | Ying et al. |
| 2003/0029563 A1 | 2/2003 | Kaushal et al. |
| 2003/0049571 A1 | 3/2003 | Hallock et al. |
| 2003/0049580 A1 | 3/2003 | Goodman |
| 2003/0056726 A1 | 3/2003 | Holst et al. |
| 2003/0075107 A1 | 4/2003 | Miyano et al. |
| 2003/0111012 A1 | 6/2003 | Takeshima |
| 2003/0113995 A1 | 6/2003 | Xia et al. |
| 2003/0132319 A1 | 7/2003 | Hytros et al. |
| 2003/0143846 A1 | 7/2003 | Sekiya et al. |
| 2003/0150386 A1 | 8/2003 | Shimada |
| 2003/0157345 A1 | 8/2003 | Beldi et al. |
| 2003/0168174 A1 | 9/2003 | Foree |
| 2003/0181065 A1 | 9/2003 | O'Donnell |
| 2003/0188682 A1 | 10/2003 | Tois et al. |
| 2003/0200926 A1 | 10/2003 | Dando et al. |
| 2003/0205237 A1 | 11/2003 | Sakuma |
| 2003/0221780 A1 | 12/2003 | Lei et al. |
| 2003/0232497 A1 | 12/2003 | Xi et al. |
| 2004/0005753 A1 | 1/2004 | Kostamo et al. |
| 2004/0018694 A1 | 1/2004 | Lee et al. |
| 2004/0058517 A1 | 3/2004 | Nallan et al. |
| 2004/0079286 A1 | 4/2004 | Lindfors |
| 2004/0083962 A1 | 5/2004 | Bang et al. |
| 2004/0099635 A1 | 5/2004 | Nishikawa |
| 2004/0104439 A1 | 6/2004 | Haukka et al. |
| 2004/0112288 A1 | 6/2004 | Whitesell |
| 2004/0118342 A1 | 6/2004 | Cheng et al. |
| 2004/0126929 A1 | 7/2004 | Tang et al. |
| 2004/0137756 A1 | 7/2004 | Li et al. |
| 2004/0154746 A1 | 8/2004 | Park |
| 2004/0163590 A1 | 8/2004 | Tran et al. |
| 2004/0224478 A1 | 11/2004 | Chudzik et al. |
| 2004/0226507 A1 | 11/2004 | Carpenter et al. |
| 2004/0231799 A1 | 11/2004 | Lee et al. |
| 2004/0241341 A1 | 12/2004 | Lin |
| 2004/0253790 A1 | 12/2004 | Ootsuka |
| 2004/0261706 A1 | 12/2004 | Lindfors et al. |
| 2005/0006682 A1 | 1/2005 | Bae et al. |
| 2005/0016452 A1 | 1/2005 | Ryu et al. |
| 2005/0023231 A1 | 2/2005 | Huang et al. |
| 2005/0051854 A1 | 3/2005 | Cabral et al. |
| 2005/0062773 A1 | 3/2005 | Fouet |
| 2005/0081786 A1 | 4/2005 | Kubista et al. |
| 2005/0085090 A1 | 4/2005 | Mui et al. |
| 2005/0090123 A1 | 4/2005 | Nishimura et al. |
| 2005/0092439 A1 | 5/2005 | Keeton et al. |
| 2005/0104112 A1 | 5/2005 | Haukka et al. |
| 2005/0112282 A1 | 5/2005 | Gordon et al. |
| 2005/0133166 A1 | 6/2005 | Satitpunwaycha et al. |
| 2005/0136657 A1 | 6/2005 | Yokoi et al. |
| 2005/0153573 A1 | 7/2005 | Okudaira et al. |
| 2005/0164469 A1 | 7/2005 | Haupt |
| 2005/0170306 A1 | 8/2005 | Oosterlaken et al. |
| 2005/0193952 A1 | 9/2005 | Goodman et al. |
| 2005/0276928 A1 | 12/2005 | Okumura et al. |
| 2005/0285208 A1 | 12/2005 | Ren et al. |
| 2006/0008997 A1 | 1/2006 | Jang et al. |
| 2006/0019495 A1 | 1/2006 | Marcadal et al. |
| 2006/0057858 A1 | 3/2006 | Chung et al. |
| 2006/0097220 A1 | 5/2006 | Kim et al. |
| 2006/0097305 A1 | 5/2006 | Lee |
| 2006/0110930 A1 | 5/2006 | Senzaki |
| 2006/0115589 A1 | 6/2006 | Vukovic |
| 2006/0118241 A1 | 6/2006 | Ohmi et al. |
| 2006/0130751 A1 | 6/2006 | Volfovski et al. |
| 2006/0133955 A1 | 6/2006 | Peters |
| 2006/0141758 A1 | 6/2006 | Naumann et al. |

(56) References Cited

U.S. PATENT DOCUMENTS

| | | |
|---|---|---|
| 2006/0148151 A1 | 7/2006 | Murthy et al. |
| 2006/0156979 A1 | 7/2006 | Thakur et al. |
| 2006/0162661 A1 | 7/2006 | Jung et al. |
| 2006/0176928 A1 | 8/2006 | Nakamura et al. |
| 2006/0193980 A1 | 8/2006 | Hasegawa |
| 2006/0211224 A1 | 9/2006 | Matsuda |
| 2006/0213441 A1 | 9/2006 | Kobrin et al. |
| 2006/0223337 A1 | 10/2006 | Ahn et al. |
| 2006/0249175 A1 | 11/2006 | Nowak et al. |
| 2006/0252244 A1 | 11/2006 | Vaartstra et al. |
| 2007/0026654 A1 | 2/2007 | Huotari et al. |
| 2007/0065597 A1 | 3/2007 | Kaido et al. |
| 2007/0087515 A1 | 4/2007 | Yieh et al. |
| 2007/0092696 A1 | 4/2007 | Tsukatani et al. |
| 2007/0111030 A1 | 5/2007 | Nakano et al. |
| 2007/0123060 A1 | 5/2007 | Rahtu |
| 2007/0128570 A1 | 6/2007 | Goto et al. |
| 2007/0134821 A1 | 6/2007 | Thakur et al. |
| 2007/0144442 A1 | 6/2007 | Migita |
| 2007/0163490 A1 | 7/2007 | Habel et al. |
| 2007/0166459 A1 | 7/2007 | Chang et al. |
| 2007/0205788 A1 | 9/2007 | Natsuhara et al. |
| 2007/0215278 A1 | 9/2007 | Furuse et al. |
| 2007/0222131 A1 | 9/2007 | Fukumoto et al. |
| 2007/0248832 A1 | 10/2007 | Maeda et al. |
| 2007/0264427 A1 | 11/2007 | Shinriki et al. |
| 2007/0264793 A1 | 11/2007 | Oh et al. |
| 2007/0281106 A1 | 12/2007 | Lubomirsky et al. |
| 2008/0032514 A1 | 2/2008 | Sano et al. |
| 2008/0035607 A1 | 2/2008 | O'Hara et al. |
| 2008/0044932 A1 | 2/2008 | Samoilov et al. |
| 2008/0069951 A1 | 3/2008 | Chacin et al. |
| 2008/0092821 A1 | 4/2008 | Otsuka et al. |
| 2008/0110401 A1 | 5/2008 | Fujikawa et al. |
| 2008/0110568 A1 | 5/2008 | Son et al. |
| 2008/0135516 A1 | 6/2008 | Yokogawa et al. |
| 2008/0135936 A1 | 6/2008 | Nakajima |
| 2008/0142046 A1 | 6/2008 | Johnson et al. |
| 2008/0157212 A1 | 7/2008 | Lavoie et al. |
| 2008/0194088 A1 | 8/2008 | Srinivasan et al. |
| 2008/0194113 A1 | 8/2008 | Kim et al. |
| 2008/0194169 A1 | 8/2008 | Sterling et al. |
| 2008/0210162 A1 | 9/2008 | Yonebayashi |
| 2008/0223725 A1 | 9/2008 | Han et al. |
| 2008/0229811 A1 | 9/2008 | Zhao et al. |
| 2008/0230352 A1 | 9/2008 | Hirata |
| 2008/0237604 A1 | 10/2008 | Alshareef et al. |
| 2008/0246101 A1 | 10/2008 | Li et al. |
| 2008/0276864 A1 | 11/2008 | Koelmel et al. |
| 2008/0293198 A1 | 11/2008 | Kojima et al. |
| 2009/0031954 A1 | 2/2009 | Nishikido et al. |
| 2009/0035463 A1 | 2/2009 | Dip |
| 2009/0035946 A1 | 2/2009 | Pierreux et al. |
| 2009/0039475 A1 | 2/2009 | Shioya |
| 2009/0060480 A1 | 3/2009 | Herchen |
| 2009/0080136 A1 | 3/2009 | Nagayama et al. |
| 2009/0093100 A1 | 4/2009 | Xia et al. |
| 2009/0117723 A1 | 5/2009 | Kim et al. |
| 2009/0176018 A1 | 7/2009 | Zou et al. |
| 2009/0236315 A1 | 9/2009 | Willwerth et al. |
| 2009/0291208 A1 | 11/2009 | Gordon et al. |
| 2009/0291566 A1 | 11/2009 | Ueno et al. |
| 2009/0297696 A1 | 12/2009 | Pore et al. |
| 2009/0297731 A1 | 12/2009 | Goundar |
| 2009/0314208 A1 | 12/2009 | Zhou et al. |
| 2009/0314309 A1 | 12/2009 | Sankarakrishnan et al. |
| 2010/0008656 A1 | 1/2010 | Sorabji et al. |
| 2010/0012153 A1 | 1/2010 | Shigemoto et al. |
| 2010/0031884 A1 | 2/2010 | Aggarwal et al. |
| 2010/0038687 A1 | 2/2010 | Klaus et al. |
| 2010/0075488 A1 | 3/2010 | Collins et al. |
| 2010/0116208 A1 | 5/2010 | Sangam |
| 2010/0119844 A1 | 5/2010 | Sun et al. |
| 2010/0121100 A1 | 5/2010 | Shay |
| 2010/0129670 A1 | 5/2010 | Sun et al. |
| 2010/0133255 A1 | 6/2010 | Bahng et al. |
| 2010/0147396 A1 | 6/2010 | Yamagishi et al. |
| 2010/0163187 A1 | 7/2010 | Yokogawa et al. |
| 2010/0178423 A1 | 7/2010 | Shimizu et al. |
| 2010/0195690 A1 | 8/2010 | Moench et al. |
| 2010/0258809 A1 | 10/2010 | Muller |
| 2010/0322822 A1 | 12/2010 | Fritchie et al. |
| 2011/0089419 A1 | 4/2011 | Yamazaki et al. |
| 2011/0091650 A1 | 4/2011 | Noguchi et al. |
| 2011/0100489 A1 | 5/2011 | Orito et al. |
| 2011/0117728 A1 | 5/2011 | Su et al. |
| 2011/0127702 A1 | 6/2011 | Gautam et al. |
| 2011/0171380 A1 | 7/2011 | Higashi et al. |
| 2011/0185969 A1 | 8/2011 | Yang |
| 2011/0186984 A1 | 8/2011 | Saito et al. |
| 2011/0195574 A1 | 8/2011 | Blasco et al. |
| 2011/0212625 A1 | 9/2011 | Toyoda et al. |
| 2011/0237082 A1 | 9/2011 | Nakajima et al. |
| 2011/0256692 A1 | 10/2011 | Tam et al. |
| 2011/0266611 A1 | 11/2011 | Kim et al. |
| 2011/0286819 A1 | 11/2011 | Shibata et al. |
| 2011/0297088 A1 | 12/2011 | Song et al. |
| 2011/0305856 A1 | 12/2011 | Bonn |
| 2011/0318142 A1 | 12/2011 | Gage et al. |
| 2012/0003599 A1 | 1/2012 | Patalay et al. |
| 2012/0027547 A1 | 2/2012 | Jager et al. |
| 2012/0055401 A1 | 3/2012 | Tozawa |
| 2012/0077350 A1 | 3/2012 | Miya et al. |
| 2012/0088369 A1 | 4/2012 | Weidman et al. |
| 2012/0094010 A1 | 4/2012 | Sugiura et al. |
| 2012/0108039 A1 | 5/2012 | Zojaji et al. |
| 2012/0111271 A1 | 5/2012 | Begamey et al. |
| 2012/0177845 A1 | 7/2012 | Odedra et al. |
| 2012/0187375 A1 | 7/2012 | Guo et al. |
| 2012/0196242 A1 | 8/2012 | Volfovski et al. |
| 2012/0219735 A1 | 8/2012 | Bakker et al. |
| 2012/0222813 A1 | 9/2012 | Pal et al. |
| 2012/0225192 A1 | 9/2012 | Yudovsky et al. |
| 2012/0231611 A1 | 9/2012 | Gatineau et al. |
| 2012/0263875 A1 | 10/2012 | Brenninger et al. |
| 2012/0269962 A1 | 10/2012 | Blomberg et al. |
| 2012/0270384 A1 | 10/2012 | Sanchez et al. |
| 2012/0270407 A1 | 10/2012 | Werner et al. |
| 2012/0276306 A1 | 11/2012 | Ueda |
| 2012/0319279 A1 | 12/2012 | Isobayashi |
| 2012/0320491 A1 | 12/2012 | Doh et al. |
| 2012/0329208 A1 | 12/2012 | Pore et al. |
| 2013/0011630 A1 | 1/2013 | Sullivan et al. |
| 2013/0012003 A1 | 1/2013 | Haukka et al. |
| 2013/0012034 A1 | 1/2013 | Ahn et al. |
| 2013/0017503 A1 | 1/2013 | De Ridder et al. |
| 2013/0023124 A1 | 1/2013 | Nemani et al. |
| 2013/0037532 A1 | 2/2013 | Volfovski et al. |
| 2013/0059415 A1 | 3/2013 | Kato et al. |
| 2013/0062839 A1 | 3/2013 | Tschinderle et al. |
| 2013/0068391 A1 | 3/2013 | Mazzocco et al. |
| 2013/0075788 A1 | 3/2013 | Tomabechi |
| 2013/0085618 A1 | 4/2013 | Ding |
| 2013/0089988 A1 | 4/2013 | Wang et al. |
| 2013/0109172 A1 | 5/2013 | Collins et al. |
| 2013/0109192 A1 | 5/2013 | Hawkins et al. |
| 2013/0143415 A1 | 6/2013 | Yudovsky et al. |
| 2013/0147050 A1 | 6/2013 | Bonner, III et al. |
| 2013/0149874 A1 | 6/2013 | Hirose et al. |
| 2013/0162142 A1 | 6/2013 | Nishino et al. |
| 2013/0203258 A1 | 8/2013 | Chen et al. |
| 2013/0206066 A1 | 8/2013 | Han et al. |
| 2013/0213300 A1 | 8/2013 | Sung et al. |
| 2013/0216710 A1 | 8/2013 | Masuda et al. |
| 2013/0220550 A1 | 8/2013 | Koo et al. |
| 2013/0230987 A1 | 9/2013 | Draeger et al. |
| 2013/0247937 A1 | 9/2013 | Nunomura et al. |
| 2013/0270600 A1 | 10/2013 | Helander et al. |
| 2013/0273330 A1 | 10/2013 | Wang et al. |
| 2014/0024223 A1 | 1/2014 | Kilpi et al. |
| 2014/0057187 A1 | 2/2014 | Suzuki et al. |
| 2014/0073082 A1 | 3/2014 | Song |
| 2014/0080314 A1 | 3/2014 | Sasajima et al. |
| 2014/0120312 A1 | 5/2014 | He et al. |

(56) References Cited

U.S. PATENT DOCUMENTS

| | | |
|---|---|---|
| 2014/0127422 A1 | 5/2014 | Shao et al. |
| 2014/0144375 A1 | 5/2014 | Kim et al. |
| 2014/0148924 A1 | 5/2014 | Brak et al. |
| 2014/0158154 A1 | 6/2014 | Kondo et al. |
| 2014/0170320 A1 | 6/2014 | Yamamoto et al. |
| 2014/0179092 A1 | 6/2014 | Kim |
| 2014/0187022 A1 | 7/2014 | Falster et al. |
| 2014/0190581 A1 | 7/2014 | Nagase et al. |
| 2014/0242808 A1 | 8/2014 | Akiyama et al. |
| 2014/0252710 A1 | 9/2014 | Cuvalci et al. |
| 2014/0256160 A1 | 9/2014 | Wada et al. |
| 2014/0271081 A1 | 9/2014 | Lavitsky et al. |
| 2014/0287164 A1 | 9/2014 | Xiao et al. |
| 2014/0290573 A1 | 10/2014 | Okabe et al. |
| 2014/0327117 A1 | 11/2014 | Bencher et al. |
| 2014/0346600 A1 | 11/2014 | Cheng et al. |
| 2014/0360430 A1 | 12/2014 | Armour et al. |
| 2015/0004806 A1 | 1/2015 | Ndiege et al. |
| 2015/0024567 A1 | 1/2015 | Tsai et al. |
| 2015/0030782 A1 | 1/2015 | Ivanov et al. |
| 2015/0061078 A1 | 3/2015 | Abel et al. |
| 2015/0069354 A1 | 3/2015 | Helander et al. |
| 2015/0087139 A1 | 3/2015 | O'Neill et al. |
| 2015/0099123 A1 | 4/2015 | Barbee et al. |
| 2015/0099375 A1 | 4/2015 | Haripin et al. |
| 2015/0104575 A1 | 4/2015 | Takoudis et al. |
| 2015/0110968 A1 | 4/2015 | Lavoie et al. |
| 2015/0126036 A1 | 5/2015 | Zhao |
| 2015/0132953 A1 | 5/2015 | Nowling et al. |
| 2015/0137315 A1 | 5/2015 | Chen et al. |
| 2015/0155140 A1 | 6/2015 | Lee et al. |
| 2015/0155370 A1 | 6/2015 | Tsai et al. |
| 2015/0170907 A1 | 6/2015 | Haukka et al. |
| 2015/0176124 A1 | 6/2015 | Greer et al. |
| 2015/0211124 A1 | 7/2015 | Nozawa et al. |
| 2015/0228513 A1 | 8/2015 | Parkhe et al. |
| 2015/0247259 A1 | 9/2015 | Hekmatshoar-Tabari et al. |
| 2015/0267299 A1 | 9/2015 | Hawkins et al. |
| 2015/0275355 A1 | 10/2015 | Mallikarjunan et al. |
| 2015/0307989 A1 | 10/2015 | Lindfors |
| 2015/0311043 A1 | 10/2015 | Sun et al. |
| 2015/0340266 A1 | 11/2015 | Ngo et al. |
| 2015/0345022 A1 | 12/2015 | Yudovsky et al. |
| 2015/0349073 A1 | 12/2015 | Kang |
| 2015/0368798 A1 | 12/2015 | Kwong |
| 2016/0005596 A1 | 1/2016 | Behera et al. |
| 2016/0010208 A1 | 1/2016 | Huang et al. |
| 2016/0032453 A1 | 2/2016 | Qian et al. |
| 2016/0035542 A1 | 2/2016 | Hausmann |
| 2016/0086811 A1 | 3/2016 | Mackedanz et al. |
| 2016/0111304 A1 | 4/2016 | Takahashi et al. |
| 2016/0133504 A1 | 5/2016 | Chu et al. |
| 2016/0152649 A1 | 6/2016 | Gordon |
| 2016/0153088 A1 | 6/2016 | Tsuji et al. |
| 2016/0168704 A1 | 6/2016 | Choi et al. |
| 2016/0169766 A1 | 6/2016 | Ishibashi et al. |
| 2016/0196969 A1 | 7/2016 | Berry et al. |
| 2016/0204005 A1 | 7/2016 | Oki et al. |
| 2016/0204436 A1 | 7/2016 | Barker et al. |
| 2016/0211166 A1 | 7/2016 | Yan et al. |
| 2016/0215387 A1 | 7/2016 | Liu et al. |
| 2016/0225588 A1 | 8/2016 | Shaikh et al. |
| 2016/0237559 A1 | 8/2016 | Tsuji |
| 2016/0273095 A1 | 9/2016 | Lin et al. |
| 2016/0273128 A1 | 9/2016 | Kang |
| 2016/0279629 A1 | 9/2016 | Michishita et al. |
| 2016/0284517 A1 | 9/2016 | Saido |
| 2016/0293609 A1 | 10/2016 | Jha et al. |
| 2016/0307740 A1 | 10/2016 | Kim et al. |
| 2016/0314960 A1 | 10/2016 | Cheng et al. |
| 2016/0343612 A1 | 11/2016 | Wang et al. |
| 2016/0343660 A1* | 11/2016 | Kim .................. H01L 23/5226 |
| 2016/0376701 A1 | 12/2016 | Takewaki et al. |
| 2017/0022612 A1 | 1/2017 | Lei et al. |
| 2017/0040146 A1 | 2/2017 | Huang et al. |
| 2017/0040198 A1 | 2/2017 | Lin et al. |
| 2017/0062224 A1 | 3/2017 | Fu et al. |
| 2017/0102612 A1 | 4/2017 | Meyers et al. |
| 2017/0114460 A1 | 4/2017 | Kim et al. |
| 2017/0140924 A1 | 5/2017 | Suzuki et al. |
| 2017/0154895 A1 | 6/2017 | Huo |
| 2017/0167023 A1 | 6/2017 | Praia et al. |
| 2017/0178939 A1 | 6/2017 | Omori |
| 2017/0178942 A1 | 6/2017 | Sakata et al. |
| 2017/0191159 A1 | 7/2017 | Polyak et al. |
| 2017/0191685 A1 | 7/2017 | Ronne et al. |
| 2017/0213960 A1 | 7/2017 | de Araujo et al. |
| 2017/0218515 A1 | 8/2017 | Shin et al. |
| 2017/0222008 A1 | 8/2017 | Hsu et al. |
| 2017/0253968 A1 | 9/2017 | Yahata |
| 2017/0256393 A1 | 9/2017 | Kim et al. |
| 2017/0263438 A1 | 9/2017 | Li et al. |
| 2017/0271143 A1 | 9/2017 | Fukiage et al. |
| 2017/0283312 A1 | 10/2017 | Lee et al. |
| 2017/0283313 A1 | 10/2017 | Lee et al. |
| 2017/0303382 A1 | 10/2017 | Smith et al. |
| 2017/0306494 A1 | 10/2017 | Lin et al. |
| 2017/0314125 A1 | 11/2017 | Fenwick et al. |
| 2017/0369993 A1 | 12/2017 | Sun |
| 2017/0372919 A1 | 12/2017 | Manna et al. |
| 2018/0047621 A1 | 2/2018 | Armini |
| 2018/0094350 A1 | 4/2018 | Verghese et al. |
| 2018/0096821 A1 | 4/2018 | Lubomirsky |
| 2018/0096844 A1 | 4/2018 | Dutartre et al. |
| 2018/0105701 A1 | 4/2018 | Larsson et al. |
| 2018/0144973 A1* | 5/2018 | Ye .................. H01L 21/02068 |
| 2018/0171472 A1 | 6/2018 | Yamada et al. |
| 2018/0209042 A1 | 7/2018 | Wu et al. |
| 2018/0265294 A1 | 9/2018 | Hayashi |
| 2018/0265972 A1 | 9/2018 | Firouzdor et al. |
| 2018/0265973 A1 | 9/2018 | Firouzdor et al. |
| 2018/0274098 A1 | 9/2018 | Takagi et al. |
| 2018/0277338 A1 | 9/2018 | Fukada et al. |
| 2018/0315597 A1 | 11/2018 | Varadarajan et al. |
| 2018/0327892 A1 | 11/2018 | Wu et al. |
| 2018/0327898 A1 | 11/2018 | Wu et al. |
| 2018/0327899 A1 | 11/2018 | Wu et al. |
| 2019/0019714 A1 | 1/2019 | Kosakai et al. |
| 2019/0035698 A1 | 1/2019 | Tanaka |
| 2019/0078206 A1 | 3/2019 | Wu et al. |
| 2019/0109043 A1 | 4/2019 | Wang et al. |
| 2019/0115451 A1 | 4/2019 | Lee et al. |
| 2019/0148177 A1 | 5/2019 | Yin et al. |
| 2019/0148556 A1 | 5/2019 | Wang et al. |
| 2019/0172701 A1 | 6/2019 | Jia et al. |
| 2019/0172714 A1 | 6/2019 | Bobek et al. |
| 2019/0176435 A1 | 6/2019 | Bellman et al. |
| 2019/0198297 A1 | 6/2019 | Aramaki et al. |
| 2019/0198359 A1 | 6/2019 | Kamimura et al. |
| 2019/0198571 A1 | 6/2019 | Xu et al. |
| 2019/0204029 A1 | 7/2019 | Tanabe |
| 2019/0211450 A1 | 7/2019 | Adachi et al. |
| 2019/0233446 A1 | 8/2019 | MacDonald et al. |
| 2019/0237325 A1 | 8/2019 | Wang et al. |
| 2019/0318910 A1 | 10/2019 | Mori |
| 2019/0319100 A1 | 10/2019 | Chen et al. |
| 2019/0362970 A1 | 11/2019 | Wang et al. |
| 2019/0362989 A1 | 11/2019 | Reuter et al. |
| 2019/0363015 A1 | 11/2019 | Cheng et al. |
| 2019/0378711 A1 | 12/2019 | Suzuki et al. |
| 2019/0385907 A1 | 12/2019 | Gottheim et al. |
| 2019/0393304 A1 | 12/2019 | Guillorn et al. |
| 2020/0012081 A1 | 1/2020 | Komai |
| 2020/0035489 A1 | 1/2020 | Huang et al. |
| 2020/0052089 A1 | 2/2020 | Yu et al. |
| 2020/0058469 A1 | 2/2020 | Ranjan et al. |
| 2020/0066512 A1 | 2/2020 | Tois et al. |
| 2020/0105895 A1 | 4/2020 | Tang et al. |
| 2020/0119038 A1 | 4/2020 | Hopkins et al. |
| 2020/0135915 A1 | 4/2020 | Savant et al. |
| 2020/0152473 A1 | 5/2020 | Tapily et al. |
| 2020/0152750 A1 | 5/2020 | Morrow et al. |
| 2020/0185249 A1 | 6/2020 | Rice et al. |
| 2020/0185257 A1 | 6/2020 | Nishiwaki |

(56) References Cited

U.S. PATENT DOCUMENTS

| | | |
|---|---|---|
| 2020/0203157 A1 | 6/2020 | Su |
| 2020/0273728 A1 | 8/2020 | Benjaminson et al. |
| 2020/0283894 A1 | 9/2020 | Lehn et al. |
| 2020/0312681 A1 | 10/2020 | Tanaka et al. |
| 2020/0385861 A1 | 12/2020 | Deye et al. |
| 2020/0385867 A1 | 12/2020 | Kim et al. |
| 2020/0385868 A1 | 12/2020 | Kim et al. |
| 2020/0395199 A1 | 12/2020 | Miyama |
| 2020/0395209 A1 | 12/2020 | Yoshimoto et al. |
| 2020/0395444 A1 | 12/2020 | Lo et al. |
| 2020/0402846 A1 | 12/2020 | Collins et al. |
| 2021/0002762 A1 | 1/2021 | Jun et al. |
| 2021/0005449 A1 | 1/2021 | Blanquart et al. |
| 2021/0005450 A1 | 1/2021 | Mattinen et al. |
| 2021/0005723 A1 | 1/2021 | Tang et al. |
| 2021/0013010 A1 | 1/2021 | Yoshikawa et al. |
| 2021/0013034 A1 | 1/2021 | Wu et al. |
| 2021/0013037 A1 | 1/2021 | Sun et al. |
| 2021/0013042 A1 | 1/2021 | Vayrynen et al. |
| 2021/0013085 A1 | 1/2021 | Roh et al. |
| 2021/0020429 A1 | 1/2021 | Khazaka et al. |
| 2021/0020431 A1 | 1/2021 | Blanquart et al. |
| 2021/0020432 A1 | 1/2021 | Blanquart |
| 2021/0020467 A1 | 1/2021 | Sekiguchi |
| 2021/0020470 A1 | 1/2021 | Lee |
| 2021/0028021 A1 | 1/2021 | Mousa et al. |
| 2021/0017648 A1 | 2/2021 | Kubota et al. |
| 2021/0032754 A1 | 2/2021 | White et al. |
| 2021/0033977 A1 | 2/2021 | Raaijmakers et al. |
| 2021/0035785 A1 | 2/2021 | Jeong et al. |
| 2021/0035786 A1 | 2/2021 | Jeong et al. |
| 2021/0035802 A1 | 2/2021 | Tolle et al. |
| 2021/0035824 A1 | 2/2021 | de Ridder |
| 2021/0035839 A1 | 2/2021 | de Ridder |
| 2021/0035840 A1 | 2/2021 | de Ridder et al. |
| 2021/0035841 A1 | 2/2021 | Fluit |
| 2021/0035842 A1 | 2/2021 | de Ridder |
| 2021/0035854 A1 | 2/2021 | Yoo et al. |
| 2021/0040613 A1 | 2/2021 | White et al. |
| 2021/0040615 A1 | 2/2021 | White et al. |
| 2021/0043444 A1 | 2/2021 | Blanquart |
| 2021/0050231 A1 | 2/2021 | Oosterlaken |
| 2021/0054500 A1 | 2/2021 | Zope et al. |
| 2021/0054504 A1 | 2/2021 | Wang et al. |
| 2021/0057214 A1 | 2/2021 | Kengoyama et al. |
| 2021/0057223 A1 | 2/2021 | Stevens et al. |
| 2021/0057275 A1 | 2/2021 | Pierreux et al. |
| 2021/0057570 A1 | 2/2021 | Lin et al. |
| 2021/0066075 A1 | 3/2021 | Zhang et al. |
| 2021/0066079 A1 | 3/2021 | Lima et al. |
| 2021/0066080 A1 | 3/2021 | Mattinen et al. |
| 2021/0066083 A1 | 3/2021 | Haukka |
| 2021/0066084 A1 | 3/2021 | Raisanen et al. |
| 2021/0070783 A1 | 3/2021 | Odedra et al. |
| 2021/0071296 A1 | 3/2021 | Watarai et al. |
| 2021/0071298 A1 | 3/2021 | Maes et al. |
| 2021/0074527 A1 | 3/2021 | Lee et al. |
| 2021/0082692 A1 | 3/2021 | Kikuchi |
| 2021/0090878 A1 | 3/2021 | Kang et al. |
| 2021/0095372 A1 | 4/2021 | Minjauw et al. |
| 2021/0102289 A1 | 4/2021 | Tsuji et al. |
| 2021/0102290 A1 | 4/2021 | Acosta et al. |
| 2021/0102292 A1 | 4/2021 | Lin et al. |
| 2021/0104384 A1 | 4/2021 | Parkhe |
| 2021/0104399 A1 | 4/2021 | Kuroda et al. |
| 2021/0108328 A1 | 4/2021 | Yanagisawa |
| 2021/0111025 A1 | 4/2021 | Zyulkov et al. |
| 2021/0111053 A1 | 4/2021 | De Ridder |
| 2021/0118667 A1 | 4/2021 | Fukazawa et al. |
| 2021/0118679 A1 | 4/2021 | Lima et al. |
| 2021/0118687 A1 | 4/2021 | Wang et al. |
| 2021/0125827 A1 | 4/2021 | Khazaka et al. |
| 2021/0125832 A1 | 4/2021 | Bhatnagar |
| 2021/0134588 A1 | 5/2021 | Kohen et al. |
| 2021/0134959 A1 | 5/2021 | Lima et al. |
| 2021/0140043 A1 | 5/2021 | Thombare et al. |
| 2021/0143003 A1 | 5/2021 | Fukuda et al. |
| 2021/0151315 A1 | 5/2021 | Pierreux et al. |
| 2021/0151348 A1 | 5/2021 | Utsuno et al. |
| 2021/0151352 A1 | 5/2021 | Zope et al. |
| 2021/0156024 A1 | 5/2021 | Roh et al. |
| 2021/0156030 A1 | 5/2021 | Shugrue |
| 2021/0159077 A1 | 5/2021 | Longrie et al. |
| 2021/0166910 A1 | 6/2021 | Kim et al. |
| 2021/0166924 A1 | 6/2021 | Moon et al. |
| 2021/0166925 A1 | 6/2021 | Moon et al. |
| 2021/0166940 A1 | 6/2021 | Nozawa |
| 2021/0172064 A1 | 6/2021 | Moon |
| 2021/0175052 A1 | 6/2021 | Takahashi et al. |
| 2021/0180184 A1 | 6/2021 | Verni et al. |
| 2021/0180188 A1 | 6/2021 | Kim et al. |
| 2021/0180189 A1 | 6/2021 | Shugrue et al. |
| 2021/0193458 A1 | 6/2021 | Salmi et al. |
| 2021/0205758 A1 | 7/2021 | Kimtee et al. |
| 2021/0207269 A1 | 7/2021 | Huang et al. |
| 2021/0207270 A1 | 7/2021 | de Ridder et al. |
| 2021/0210373 A1 | 7/2021 | Singu et al. |
| 2021/0214842 A1 | 7/2021 | Yoon et al. |
| 2021/0225615 A1 | 7/2021 | Yoshida |
| 2021/0225622 A1 | 7/2021 | Shoji |
| 2021/0225642 A1 | 7/2021 | Utsuno et al. |
| 2021/0225643 A1 | 7/2021 | Kuroda et al. |
| 2021/0230744 A1 | 7/2021 | Kimtee et al. |
| 2021/0230746 A1 | 7/2021 | Shiba |
| 2021/0233772 A1 | 7/2021 | Zhu et al. |
| 2021/0238736 A1 | 8/2021 | Butail et al. |
| 2021/0238742 A1 | 8/2021 | Susa et al. |
| 2021/0239614 A1 | 8/2021 | Muralidhar et al. |
| 2021/0242011 A1 | 8/2021 | Shero et al. |
| 2021/0246556 A1 | 8/2021 | Mori |
| 2021/0247693 A1 | 8/2021 | Maes et al. |
| 2021/0249303 A1 | 8/2021 | Blanquart |
| 2021/0254216 A1 | 8/2021 | Mori et al. |
| 2021/0254238 A1 | 8/2021 | Khazaka et al. |
| 2021/0257213 A1 | 8/2021 | Kikuchi et al. |
| 2021/0257509 A1 | 8/2021 | Nishiwaki |
| 2021/0265134 A1 | 8/2021 | Singh et al. |
| 2021/0265158 A1 | 8/2021 | Kaneko |
| 2021/0268554 A1 | 9/2021 | Mori |
| 2021/0269914 A1 | 9/2021 | Väyrynen et al. |
| 2021/0272821 A1 | 9/2021 | Oosterlaken |
| 2021/0273109 A1 | 9/2021 | Yamazaki et al. |
| 2021/0280448 A1 | 9/2021 | Ganguli et al. |
| 2021/0285102 A1 | 9/2021 | Yoon et al. |
| 2021/0287878 A1 | 9/2021 | Um et al. |
| 2021/0287912 A1 | 9/2021 | Shiba et al. |
| 2021/0287928 A1 | 9/2021 | Kim et al. |
| 2021/0288476 A1 | 9/2021 | Wei |
| 2021/0292902 A1 | 9/2021 | Kajbafvala et al. |
| 2021/0296130 A1 | 9/2021 | Longrie et al. |
| 2021/0296144 A1 | 9/2021 | Lin et al. |
| 2021/0310125 A1 | 10/2021 | Ma et al. |
| 2021/0313150 A1 | 10/2021 | Kang et al. |
| 2021/0313167 A1 | 10/2021 | Pore et al. |
| 2021/0313170 A1 | 10/2021 | Suzuki |
| 2021/0313178 A1 | 10/2021 | Nakano |
| 2021/0313182 A1 | 10/2021 | Zhu et al. |
| 2021/0317576 A1 | 10/2021 | Väyrynen et al. |
| 2021/0319982 A1 | 10/2021 | Kim et al. |
| 2021/0320003 A1 | 10/2021 | Sugiura et al. |
| 2021/0320010 A1 | 10/2021 | Wang et al. |
| 2021/0320020 A1 | 10/2021 | Oosterlaken et al. |
| 2021/0324510 A1 | 10/2021 | Kuwano et al. |
| 2021/0324518 A1 | 10/2021 | de Ridder |
| 2021/0327704 A1 | 10/2021 | Kajbafvala et al. |
| 2021/0327714 A1 | 10/2021 | Lee et al. |
| 2021/0327715 A1 | 10/2021 | Xie et al. |
| 2021/0328036 A1 | 10/2021 | Li et al. |
| 2021/0041284 A1 | 11/2021 | Yednak |

FOREIGN PATENT DOCUMENTS

| | | |
|---|---|---|
| CN | 102094183 | 6/2011 |
| CN | 102539019 | 9/2013 |

(56) References Cited

FOREIGN PATENT DOCUMENTS

| | | |
|---|---|---|
| CN | 203721699 | 7/2014 |
| CN | 104307264 | 1/2015 |
| CN | 104498895 | 4/2015 |
| CN | 104517892 | 4/2015 |
| CN | 204629865 | 9/2015 |
| CN | 205448240 | 8/2016 |
| CN | 104342637 | 2/2017 |
| CN | 206145834 | 5/2017 |
| CN | 104233226 | 6/2017 |
| CN | 106895521 | 6/2017 |
| CN | 104630735 | 12/2017 |
| CN | 107675144 | 2/2018 |
| CN | 106011785 | 10/2018 |
| CN | 108910843 | 11/2018 |
| CN | 109000352 | 12/2018 |
| EP | 0634785 | 1/1995 |
| EP | 678909 | 7/1999 |
| EP | 1061567 | 12/2000 |
| FR | 2708624 | 2/1995 |
| GB | 400010 | 10/1933 |
| GB | 2051875 | 1/1981 |
| JP | S5979545 | 5/1984 |
| JP | S59127847 | 7/1984 |
| JP | S60110133 | 6/1985 |
| JP | H0165766 | 6/1989 |
| JP | H01185176 | 7/1989 |
| JP | H01313954 | 12/1989 |
| JP | H03211753 | 9/1991 |
| JP | H0616433 | 6/1994 |
| JP | 2002118066 | 4/2002 |
| JP | 2004088077 | 3/2004 |
| JP | 2004244298 | 9/2004 |
| JP | 2005033221 | 9/2004 |
| JP | 2006124831 | 5/2006 |
| JP | 2013196822 | 9/2013 |
| JP | 2015021175 | 2/2015 |
| JP | 2017220011 | 12/2017 |
| KR | 20000000946 | 1/2000 |
| KR | 100273261 | 12/2000 |
| KR | 20070041701 | 4/2007 |
| KR | 10-2007-0117817 | 12/2007 |
| KR | 10-2009-0105977 | 10/2009 |
| KR | 10-2010-0015073 | 2/2010 |
| KR | 10-2010-0122701 | 11/2010 |
| KR | 10-2011-0058534 | 6/2011 |
| KR | 10-2013-0129149 | 11/2013 |
| KR | 101758892 | 7/2017 |
| TW | 201213596 | 4/2012 |
| TW | 201234453 | 8/2012 |
| TW | M446412 | 2/2013 |
| TW | M512254 | 11/2015 |
| TW | 1514509 | 12/2015 |
| TW | 201613231 | 4/2016 |
| TW | M553518 | 12/2017 |
| WO | 2004007800 | 1/2004 |
| WO | 2007088940 | 8/2007 |
| WO | 2013177269 | 11/2013 |
| WO | 2015127614 | 9/2015 |
| WO | 2016019795 | 2/2016 |
| WO | 2017125401 | 7/2017 |
| WO | 2019142055 | 7/2019 |
| WO | 2019214578 | 11/2019 |
| WO | 2020118100 | 6/2020 |
| WO | 2021072042 | 4/2021 |

OTHER PUBLICATIONS

CNIPA; Office Action dated Nov. 20, 2020 in Application No. 201710762817.6.
CNIPA; Notice of Allowance dated Dec. 28, 2020 in Application No. 201930704935.1.
CNIPA; Notice of Allowance dated Dec. 10, 2020 in Application No. 202030352604.9.
CNIPA; Office Action dated Jan. 25, 2021 in Application No. 202030579755.8.
JPO; Notice of Allowance dated Nov. 27, 2020 in Application No. 2016-206625.
JPO; Office Action dated Jan. 26, 2021 in Application No. 2017-139817.
JPO; Notice of Allowance dated Nov. 26, 2020 in Application No. 2020-502653.
KIPO; Office Action dated Jan. 25, 2021 in Application No. 10-2014-0011765.
KIPO; Notice of Allowance dated Jan. 4, 2021 in Application No. 10-2014-0060120.
KIPO; Notice of Allowance dated Jan. 4, 2021 in Application No. 10-2014-0071653.
KIPO; Office Action dated Nov. 29, 2020 in Application No. 10-2014-0105478.
KIPO; Office Action dated Feb. 17, 2021 in Application No. 10-2014-0122903.
KIPO; Office Action dated Jan. 25, 2021 in Application No. 10-2014-0145220.
KIPO; Office Action dated Jan. 6, 2021 in Application No. 10-2015-0025314.
KIPO; Office Action dated Dec. 23, 2020 in Application No. 10-2019-0044213.
KIPO; Office Action dated Nov. 14, 2020 in Application No. 10-2020-0101096.
KIPO; Notice of Allowance dated Oct. 20, 2020 in Application No. 30-2019-0054642.
KIPO; Notice of Allowance dated Oct. 22, 2020 in Application No. 30-2019-0058566 (M001).
KIPO; Notice of Allowance dated Oct. 22, 2020 in Application No. 30-2019-0058566 (M002).
KIPO; Notice of Allowance dated Dec. 1, 2020 in Application No. 30-2019-0061607.
KIPO; Office Action dated Jan. 26, 2021 in Application No. 30-2020-0005953 (M001).
KIPO; Office Action dated Jan. 26, 2021 in Application No. 30-2020-0005953 (M002).
KIPO; Notice of Allowance dated Dec. 23, 2020 in Application No. 30-2020-0006059.
KIPO; Notice of Allownace dated Dec. 25, 2020 in Application No. 30-2020-0006223.
KIPO; Notice of Allowance dated Feb. 1, 2021 in Application No. 30-2020-0006385.
KIPO; Notice of Allowance dated Feb. 1, 2021 in Application No. 30-2020-0006391.
TIPO; Office Action dated Dec. 2, 2020 in Application No. 105131896.
TIPO; Notice of Allowance dated Jan. 29, 2021 in Application No. 105142668.
TIPO; Notice of Allowance dated Dec. 10, 2020 in Application No. 106108152.
TIPO; Notice of Allowance dated Jan. 25, 2021 in Application No. 106111548.
TIPO; Office Action dated Sep. 30, 2020 in Application No. 106113604.
TIPO; Office Action dated Jan. 6, 2021 in Application No. 106115126.
TIPO; Office Action dated Dec. 21, 2020 in Application No. 106122231.
TIPO; Office Action dated Dec. 29, 2020 in Application No. 106124126.
TIPO; Office Action dated Dec. 9, 2020 in Application No. 106124128.
TIPO; Office Action dated Jan. 25, 2021 in Application No. 106124129.
TIPO; Office Action dated Dec. 9, 2020 in Application No. 106124130.
TIPO; Office Action dated Jan. 20, 2021 in Application No. 106129491.
TIPO; Office Action dated Feb. 8, 2021 in Application No. 106133152.
TIPO; Office Action dated Dec. 24, 2019 in Application No. 108105002.
TIPO; Notice of Allowance dated Nov. 24, 2020 in Application No. 108307599.
TIPO; Notice of Allowance dated Jan. 11, 2021 in Application No. 108307599D01.
TIPO; Notice of Allowance dated Jan. 11, 2021 in Application No. 109300591.

(56) References Cited

OTHER PUBLICATIONS

TIPO; Notice of Allowance dated Jan. 11, 2021 in Application No. 109300593.
TIPO; Office Action dated Jan. 11, 2021 in Application No. 109300594.
USPTO; Non-Final Office Action dated Dec. 1, 2020 in U.S. Appl. No. 14/219,879.
USPTO; Final Office Action dated Feb. 1, 2021 in U.S. Appl. No. 14/829,565.
USPTO; Non-Final Office Action dated Dec. 24, 2020 in U.S. Appl. No. 15/286,503.
USPTO; Final Office Action dated Feb. 12, 2021 in U.S. Appl. No. 15/377,439.
USPTO Non-Final Office Action dated Dec. 10, 2020 in U.S. Appl. No. 15/380,921.
USPTO; Non-Final Office Action dated Feb. 3, 2021 in U.S. Appl. No. 15/611,707.
USPTO; Final Office Action dated Jan. 19, 2021 in U.S. Appl. No. 15/636,307.
USPTO; Non-Final Office Action dated Jan. 6, 2021 in U.S. Appl. No. 15/726,959.
USPTO; Advisory Action dated Dec. 15, 2020 in U.S. Appl. No. 15/835,328.
USPTO; Notice of Allowance dated Jan. 14, 2021 in U.S. Appl. No. 15/835,352.
USPTO; Final Office Action dated Jan. 11, 2021 in U.S. Appl. No. 15/890,037.
USPTO; Advisory Action dated Jan. 8, 2021 in U.S. Appl. No. 15/923,834.
USPTO; Advisory Action dated Dec. 24, 2020 in U.S. Appl. No. 15/925,532.
USPTO; Non-Final Office Action dated Jan. 25, 2021 in U.S. Appl. No. 15/925,532.
USPTO; Final Office Action dated Feb. 18, 2021 in U.S. Appl. No. 15/940,729.
USPTO; Final Office Action dated Jan. 12, 2021 in U.S. Appl. No. 15/940,759.
USPTO; Final Office Action dated Dec. 15, 2020 in U.S. Appl. No. 15/962,980.
USPTO; Advisory Action dated Oct. 27, 2020 in U.S. Appl. No. 15/974,948.
USPTO; Advisory Action dated Dec. 10, 2020 in U.S. Appl. No. 16/000,109.
USPTO; Advisory Action dated Dec. 15, 2020 in U.S. Appl. No. 16/000,125.
USPTO; Advisory Action dated Dec. 14, 2020 in U.S. Appl. No. 16/000,156.
USPTO; Advisory Action dated Dec. 22, 2020 in U.S. Appl. No. 16/004,041.
USPTO; Non-Final Office Action dated Nov. 24, 2020 in U.S. Appl. No. 16/039,938.
USPTO; Advisory Action dated Jan. 14, 2021 in U.S. Appl. No. 16/055,532.
USPTO; Final Office Action dated Dec. 15, 2020 in U.S. Appl. No. 16/108,950.
USPTO; Final Office Action dated Jan. 6, 2021 in U.S. Appl. No. 16/117,530.
USPTO; Notice of Allowance dated Feb. 12, 2021 in U.S. Appl. No. 16/128,282.
USPTO; Notice of Allowance dated Feb. 8, 2021 in U.S. Appl. No. 16/132,142.
USPTO; Final Office Action dated Dec. 14, 2020 in U.S. Appl. No. 16/151,074.
USPTO; Advisory Action dated Feb. 16, 2021 in U.S. Appl. No. 16/151,074.
USPTO; Final Office Action dated Dec. 18, 2020 in U.S. Appl. No. 16/167,164.
USPTO; Advisory Action dated Dec. 21, 2020 in U.S. Appl. No. 16/172,535.
USPTO; Final Office Action dated Jan. 29, 2021 in U.S. Appl. No. 16/176,517.
USPTO; Non-Final Office Action dated Dec. 11, 2021 in U.S. Appl. No. 16/202,941.
USPTO; Final Office Action dated Dec. 9, 2020 in U.S. Appl. No. 16/210,922.
USPTO; Notice of Allowance dated Dec. 15, 2020 in U.S. Appl. No. 16/242,852.
USPTO; Advisory Action dated Jan. 22, 2021 in U.S. Appl. No. 16/252,567.
USPTO; Final Office Action dated Dec. 8, 2020 in U.S. Appl. No. 16/397,045.
USPTO; Advisory Action dated Jan. 27, 2021 in U.S. Appl. No. 16/397,045.
USPTO; Final Office Action dated Dec. 14, 2020 in U.S. Appl. No. 16/400,814.
USPTO; Non-Final Office Action dated Jan. 12, 2021 in U.S. Appl. No. 16/453,249.
USPTO; Non-Final Office Action dated Dec. 28, 2020 in U.S. Appl. No. 16/517,122.
USPTO; Non-Final Office Action dated Feb. 11, 2021 in U.S. Appl. No. 16/565,460.
USPTO; Notice of Allowance dated Jan. 25, 2021 in U.S. Appl. No. 16/679,885.
USPTO; Non-Final Office Action dated Feb. 8, 2021 in U.S. Appl. No. 16/685,787.
USPTO; Non-Final Office Action dated Jan. 8, 2021 in U.S. Appl. No. 16/752,514.
USPTO; Notice of Allowance dated Dec. 28, 2020 in U.S. Appl. No. 16/833,279.
USPTO; Notice of Allowance dated Nov. 23, 2020 in U.S. Appl. No. 29/726,623.
Aoyagi et al. "Laser-assisted atomic layer epitaxy" Materials Science and Engineering, pp. 121-132 (1991).
Galesic et al. "Formation of vanadium nitride by rapid thermal processing" Thin Solid Films 349(1), 7 pages (1999).
Kim et al. "High Growth Rate in Atomic Layer Deposition of $TiO_2$ Thin Films by UV Irradiation" Electrochemical and Solid-State Letters, 14(4), pp. H146-H148 (2011).
Lee et al. "Enahancement of Iodine Adsorption on Ruthenium Glue Layer for Seedless CECVD of Cu" Electrochemical and Solid-State Letters, 8(2) C39-C42 (2005).
Lee et al. "Growth without Postannealing of Monoclinic $VO_2$ Thin Film by Atomic Layer Deposition Using $VC_{14}$ as Precursor" Coatings, 8, 431, pp. 1-11 (2018).
Lee et al. "Photo-Induced Atomic Layer Deposition of Tantalum Oxide Thin Films from $Ta(OC_2H_5)_5$ and $O_2$" J of the Electrochemical Society. 151(1) pp. C52-C55 (2004).
Merdrignac-Conanec et al. "Nitridation under ammonia of high surface area vanadium aerogels" Journal of Solid State Chemistry 178(1), 8 pages (2005).
Nikolic et al. "The dependence of the work function of rare earth metals on their electron structure" Microelectronics Journal 27, 93-96 (1996).
Putkonen et al. "Low-Temperature ALE Deposition of $Y_2O_3$ Thin Films from β-Diketonate Precursors" Chemical Vapor Deposition 7(1) pp. 44-50 (2001).
U.S. Appl. No. 62/274,238, filed Jan. 1, 2016 in the names of Alexander S. Polyak et al., and entitled "Non-Metallic Thermal CVD/ALD Gas Injector and Purge System" pp. 1-63 (2016).
Vayrynen et al. "Photo-Assisted Atomic Layer Deposition and Chemical Vapor Deposition of Metal and Metal Oxide Thin Films" Thesis, Oct. 2015, 146 pages (2005).
CNIPA; Office Action dated Jul. 21, 2021 in Application No. 201610131743.1.
CNIPA; Office Action dated Jul. 23, 2021 in Application No. 201710131319.1.
CNIPA; Notice of Allowance dated Jun. 3, 2021 in Application No. 201711057929.8.
CNIPA; Office Action dated Sep. 13, 2021 in Application No. 201780076230.8.
CNIPA; Office Action dated Sep. 13, 2021 in Application No. 201780076321.1.
CNIPA; Office Action dated Apr. 30, 2021 in Application No. 201810018936.5.

(56) References Cited

OTHER PUBLICATIONS

CNIPA; Office Action dated Apr. 16, 2021 in Application No. 201810116717.0.
CNIPA; Notice of Allowance dated Sep. 15, 2021 in Application No. 201810116717.0.
CNIPA; Office Action dated May 26, 2021 in Application No. 201810215131.X.
CNIPA; Office Action dated Jun. 16, 2021 in Application No. 201810344382.8.
CNIPA; Notice of Allowance dated Oct. 11, 2021 in Application No. 201810344382.8.
CNIPA; Office Action dated Jul. 5, 2021 in Application No. 201810530514.6.
CNIPA; Office Action dated Jun. 30, 2021 in Application No. 201810755771.X.
CNIPA; Office Action dated Sep. 23, 2021 in Application No. 201880048547.5.
CNIPA; Office Action dated May 19, 2021 in Application No. 201880072606.2.
CNIPA; Office Action dated May 31, 2021 in Application No. 201910857144.1.
CNIPA; Office Action dated Jun. 2, 2021 in Application No. 201910920881.1.
CNIPA; Office Action dated Jul. 5, 2021 in Application No. 201911042495.3.
CNIPA; Office Action dated Apr. 27, 2021 in Application No. 201911250100.9.
CNIPA; Office Action dated Jul. 7, 2021 in Application No. 201980011788.7.
CNIPA; Notice of Allowance dated Jun. 16, 2021 in Application No. 202130111248.6.
EPO; Extended European Search Report dated Aug. 11, 2021 in Application No. 21169226.4.
JPO; Notice of Allowance dated Aug. 11, 2021 in Application No. 2018-024655.
JPO; Office Action dated Aug. 2, 2021 in Application No. 2019-504674.
JPO; Office Action dated Sep. 10, 2021 in Application No. 2019-531445.
JPO; Notice of Allowance dated Jun. 30, 2021 in Application No. 2021-004208.
KIPO; Office Action dated Jun. 28, 2021 in Application No. 10-2014-0027217.
KIPO; Notice of Allowance dated May 27, 2021 in Application No. 10-2014-0105478.
KIPO; Notice of Allowance dated Aug. 17, 2021 in Application No. 10-2014-0122903.
KIPO; Notice of Allowance dated Sep. 8, 2021 in Application No. 10-2014-0136089.
KIPO; Notice of Allowance dated Jul. 6, 2021 in Application No. 10-2014-0145220.
KIPO; Notice of Allowance dated Sep. 23, 2021 in Application No. 2014-0156196.
KIPO; Notice of Allowance dated Jul. 21, 2021 in Application No. 10-2015-0025314.
KIPO; Office Action dated May 19, 2021 in Application No. 10-2015-0036819.
KIPO; Office Action dated Jun. 23, 2021 in Application No. 10-2015-0037658.
KIPO; Office Action dated Sep. 6, 2021 in Application No. 10-2015-0046393.
KIPO; Office Action dated Jun. 10, 2021 in Application No. 2015-61391.
KIPO; Office Action dated Sep. 3, 2021 in Application No. 2017-37847.
KIPO; Office Action dated Aug. 2, 2021 in Application No. 2017-43865.
KIPO; Office Action dated Oct. 1, 2021 in Application No. 2017-43919.
KIPO; Office Action dated Sep. 28, 2021 in Application No. 2017-49172.
KIPO; Notice of Allowance dated Sep. 28, 2021 in Application No. 2017-54647.
KIPO; Office Action dated Aug. 30, 2021 in Application No. 2017-81515.
KIPO; Office Action dated Sep. 10, 2021 in Application No. 2017-86083.
KIPO; Office Action dated Jun. 29, 2021 in Application No. 10-2017-0066979.
KIPO; Notice of Allowance dated Jun. 24, 2021 in Application No. 10-2019-0044213.
KIPO; Office Action dated Jun. 17, 2021 in Application No. 10-2021-0051860.
KIPO; Office Action dated Aug. 18, 2021 in Application No. 10-2021-0090283.
KIPO; Notice of Allowance dated Sep. 2, 2021 in Application No. 30-2020-0047043.
TIPO; Office Action dated Jun. 22, 2021 in Application No. 104108277.
TIPO; Notice of Allowance dated Sep. 22, 2021 in Application No. 104108277.
TIPO; Office Action dated Jun. 2, 2021 in Application No. 105129977.
TIPO; Notice of Allowance dated Sep. 9, 2021 in Application No. 105129977.
TIPO; Notice of Allowance dated Jun. 4, 2021 in Application No. 105131896.
TIPO; Notice of Allowance dated Jul. 30, 2021 in Application No. 105134275.
TIPO; Notice of Allowance dated Feb. 24, 2021 in Application No. 106113604.
TIPO; Notice of Allowance dated Sep. 3, 2021 in Application No. 106115126.
TIPO; Office Action dated Jun. 21, 2021 in Application No. 106120902.
TIPO; Notice of Allowance dated Jun. 30, 2021 in Application No. 106121797.
TIPO; Notice of Allowance dated Sep. 1, 2021 in Application No. 106122231.
TIPO; Notice of Allowance dated Jun. 3, 2021 in Application No. 106123203.
TIPO; Notice of Allowance dated Aug. 24, 2021 in Application No. 106124129.
TIPO; Notice of Allowance dated Jul. 28, 2021 in Application No. 106129491.
TIPO; Notice of Allowance dated Aug. 10, 2021 in Application No. 106129971.
TIPO; Office Action dated Jun. 15, 2021 in Application No. 106133152.
TIPO; Notice of Allowance dated Oct. 12, 2021 in Application No. 106135925.
TIPO; Office Action dated Jul. 13, 2021 in Application No. 106138996.
TIPO; Notice of Allowance dated Sep. 24, 2021 in Application No. 106143559.
TIPO; Office Action dated Aug. 5, 2021 in Application No. 106143566.
TIPO; Office Action dated May 26, 2021 in Application No. 106143568.
TIPO; Notice of Allowance dated Jul. 30, 2021 in Application No. 106143570.
TIPO; Office Action dated Jun. 7, 2021 in Application No. 107103230.
TIPO; Office Action dated Aug. 10, 2021 in Application No. 107103230.
TIPO; Office Action dated Sep. 8, 2021 in Application No. 107105788.
TIPO; Office Action dated Aug. 3, 2021 in Application No. 107105982.
TIPO; Office Action dated Aug. 16, 2021 in Application No. 107114888.
TIPO; Office Action dated Sep. 28, 2021 in Application No. 109112983.
TIPO; Office Action dated Sep. 13, 2021 in Application No. 109119438.
TIPO; Office Action dated Oct. 18, 2021 in Application No. 109300594.
TIPO; Notice of Allowance dated Jun. 9, 2021 in Application No. 109303437.
TIPO; Notice of Allowance dated Oct. 1, 2021 in Application No. 110118827.

(56) References Cited

OTHER PUBLICATIONS

TIPO; Notice of Allowance dated Jun. 30, 2021 in Application No. 110301018.
TIPO; Notice of Allowance dated Jul. 29, 2021 in Application No. 110301101.
TIPO; Notice of Allowance dated Jul. 27, 2021 in Application No. 110302670.
USPTO; Final Office Action dated Aug. 4, 2021 in U.S. Appl. No. 14/219,879.
USPTO; Non-Final Office Action dated Jun. 10, 2021 in U.S. Appl. No. 15/262,990.
USPTO; Final Office Action dated Oct. 1, 2021 in U.S. Appl. No. 15/262,990.
USPTO; Non-Final Office Action dated Jul. 9, 2021 in U.S. Appl. No. 15/286,503.
USPTO; Notice of Allowance dated Jun. 29, 2021 in U.S. Appl. No. 15/377,439.
USPTO; Non-Final Office Action dated Jun. 25, 2021 in U.S. Appl. No. 15/380,909.
USPTO; Final Office Action dated Jun. 21, 2021 in Application No. 15/380,921.
USPTO; Advisory Action dated Aug. 30, 2021 in U.S. Appl. No. 15/380,921.
USPTO; Non-Final Office Action dated Oct. 6, 2021 in U.S. Appl. No. 15/380,921.
USPTO; Advisory Action dated Jul. 27, 2021 in U.S. Appl. No. 15/402,993.
USPTO; Final Office Action dated Jun. 9, 2021 in U.S. Appl. No. 15/491,726.
USPTO; Advisory Action dated Aug. 24, 2021 in U.S. Appl. No. 15/491,726.
USPTO; Non-Final Office Action dated Sep. 28, 2021 in U.S. Appl. No. 15/491,726.
USPTO; Notice of Allowance dated Aug. 25, 2021 in U.S. Appl. No. 15/611,707.
USPTO; Non-Final Office Action dated Sep. 16, 2021 in U.S. Appl. No. 15/636,307.
USPTO; Advisory Action dated Jun. 11, 2021 in U.S. Appl. No. 15/690,017.
USPTO; Non-Final Office Action dated Jun. 17, 2021 in U.S. Appl. No. 15/690,017.
USPTO; Final Office Action dated Jul. 15, 2021 in U.S. Appl. No. 15/726,959.
USPTO; Advisory Action dated Sep. 21, 2021 in U.S. Appl. No. 15/726,959.
USPTO; Notice of Allowance dated Sep. 15, 2021 in U.S. Appl. No. 15/835,328.
USPTO; Advisory Action dated Jun. 11, 2021 in U.S. Appl. No. 15/909,705.
USPTO; Notice of Allowance dated Jun. 4, 2021 in U.S. Appl. No. 15/923,834.
USPTO; Final Office Action dated Jun. 28, 2021 in U.S. Appl. No. 15/925,532.
USPTO; Advisory Action dated Aug. 27, 2021 in U.S. Appl. No. 15/925,532.
USPTO; Non-Final Office Action dated Oct. 6, 2021 in U.S. Appl. No. 15/925,532.
USPTO; Non-Final Office Action dated Jun. 16, 2021 in U.S. Appl. No. 15/940,729.
USPTO; Notice of Allowance dated Sep. 28, 2021 in U.S. Appl. No. 15/940,729.
USPTO; Non-Final Office Action dated Aug. 2, 2021 in U.S. Appl. No. 15/962,980.
USPTO; Non-Final Office Action dated Oct. 4, 2021 in U.S. Appl. No. 15/967,146.
USPTO; Final Office Action dated Aug. 3, 2021 in U.S. Appl. No. 15/974,948.
USPTO; Advisory Action dated Oct. 21, 2021 in U.S. Appl. No. 15/974,948.
USPTO; Final Office Action dated Oct. 12, 2021 in U.S. Appl. No. 15/996,286.
USPTO; Non-Final Office Action dated Jul. 9, 2021 in U.S. Appl. No. 15/997,445.
USPTO; Final Office Action dated Aug. 5, 2021 in U.S. Appl. No. 16/000,109.
USPTO; Final Office Action dated Oct. 20, 2021 in U.S. Appl. No. 16/000,125.
USPTO; Final Office Action dated Sep. 3, 2021 in U.S. Appl. No. 16/004,041.
USPTO; Non-Final Office Action dated Oct. 22, 2021 in U.S. Appl. No. 16/042,791.
USPTO; Non-Final Office Action dated Sep. 28, 2021 in U.S. Appl. No. 16/105,745.
USPTO; Non-Final Office Action dated Sep. 29, 2021 in U.S. Appl. No. 16/105,761.
USPTO; Non-Final Office Action dated Jun. 25, 2021 in U.S. Appl. No. 16/105,802.
USPTO; Final Office Action dated Jul. 27, 2021 in U.S. Appl. No. 16/108,950.
USPTO; Advisory Action dated Oct. 1, 2021 in U.S. Appl. No. 16/108,950.
USPTO; Non-Final Office Action dated Jun. 18, 2021 in U.S. Appl. No. 16/117,530.
USPTO; Final Office Action dated Jul. 8, 2021 in U.S. Appl. No. 16/151,074.
USPTO; Notice of Allowance dated Sep. 17, 2021 in U.S. Appl. No. 16/151,074.
USPTO; Non-Final Office Action dated Sep. 16, 2021 in U.S. Appl. No. 16/152,260.
USPTO; Advisory Action dated Aug. 2, 2021 in U.S. Appl. No. 16/172,535.
USPTO; Non-Final Office Action dated Oct. 15, 2021 in U.S. Appl. No. 16/172,535.
USPTO; Final Office Action dated Jun. 14, 2021 in U.S. Appl. No. 16/202,941.
USPTO; Advisory Action dated Aug. 16, 2021 in U.S. Appl. No. 16/202,941.
USPTO; Non-Final Office Action dated Sep. 20, 2021 in U.S. Appl. No. 16/202,941.
USPTO; Final Office Action dated Jul. 26, 2021 in U.S. Appl. No. 16/206,589.
USPTO; Notice of Allowance dated Sep. 13, 2021 in U.S. Appl. No. 16/206,589.
USPTO; Non-Final Office Action dated Aug. 25, 2021 in U.S. Appl. No. 16/210,922.
USPTO; Final Office Action dated Sep. 1, 2021 in Application No. 16/240,392.
USPTO; Notice of Allowance dated Oct. 15, 2021 in Application No. 16/240,392.
USPTO; Final Office Action dated Sep. 7, 2021 in U.S. Appl. No. 16/251,534.
USPTO; Final Office Action dated Aug. 18, 2021 in U.S. Appl. No. 16/252,567.
USPTO; Final Office Action dated Sep. 21, 2021 in U.S. Appl. No. 16/252,569.
USPTO; Advisory Action dated Jul. 15, 2021 in U.S. Appl. No. 16/468,258.
USPTO; Non-Final Office Action dated Oct. 21, 2021 in U.S. Appl. No. 16/468,258.
USPTO; Final Office Action dated May 12, 2021 in U.S. Appl. No. 16/546,543.
USPTO; Advisory Action dated Jul. 8, 2021 in U.S. Appl. No. 16/546,543.
USPTO; Ex Parte Quayle Action dated Aug. 6, 2021 in U.S. Appl. No. 16/563,473.
USPTO; Notice of Allowance dated Sep. 30, 2021 in U.S. Appl. No. 16/563,473.
USPTO; Non-Final Office Action dated Oct. 5, 2021 in U.S. Appl. No. 16/588,807.
USPTO; Notice of Allowance dated Oct. 18, 2021 in U.S. Appl. No. 16/601,593.

(56) References Cited

OTHER PUBLICATIONS

USPTO; Non-Final Office Action dated Jun. 11, 2021 in U.S. Appl. No. 16/671,847.
USPTO; Non-Final Office Action dated Jun. 24, 2021 in U.S. Appl. No. 16/673,860.
USPTO; Non-Final Office Action dated Sep. 28, 2021 in U.S. Appl. No. 16/692,859.
USPTO; Notice of Allowance dated Jul. 20, 2021 in U.S. Appl. No. 16/704,835.
USPTO; Non-Final Office Action dated Aug. 31, 2021 in U.S. Appl. No. 16/712,707.
USPTO; Non-Final Office Action dated Sep. 21, 2021 in U.S. Appl. No. 16/736,336.
USPTO; Final Office Action dated Sep. 15, 2021 in U.S. Appl. No. 16/789,138.
USPTO; Non-Final Office Action dated Jun. 24, 2021 in U.S. Appl. No. 16/792,058.
USPTO; Notice of Allowance dated Oct. 19, 2021 in U.S. Appl. No. 16/792,058.
USPTO; Non-Final Office Action dated Oct. 6, 2021 in U.S. Appl. No. 16/792,544.
USPTO; Notice of Allowance dated Sep. 27, 2021 in U.S. Appl. No. 16/792,571.
USPTO; Non-Final Office Action dated Aug. 17, 2021 in U.S. Appl. No. 16/797,346.
USPTO; Notice of Allowance dated Jul. 21, 2021 in U.S. Appl. No. 16/816,078.
USPTO; Non-Final Office Action dated Jun. 23, 2021 in U.S. Appl. No. 16/827,012.
USPTO; Non-Final Office Action dated Feb. 23, 2021 in U.S. Appl. No. 16/827,506.
USPTO; Notice of Allowance dated May 27, 2021 in U.S. Appl. No. 16/827,506.
USPTO; Final Office Action dated Oct. 6, 2021 in U.S. Appl. No. 16/828,753.
USPTO; Non-Final Office Action dated Jul. 28, 2021 in U.S. Appl. No. 16/835,283.
USPTO; Non-Final Office Action dated Oct. 4, 2021 in U.S. Appl. No. 16/840,960.
USPTO; Non-Final Office Action dated Aug. 3, 2021 in U.S. Appl. No. 16/849,793.
USPTO; Non-Final Office Action dated Jun. 15, 2021 in U.S. Appl. No. 16/861,144.
USPTO; Final Office Action dated Sep. 17, 2021 in U.S. Appl. No. 16/861,144.
USPTO; Non-Final Office Action dated Sep. 1, 2021 in U.S. Appl. No. 16/867,385.
USPTO; Final Office Action dated Oct. 7, 2021 in U.S. Appl. No. 16/872,045.
USPTO; Final Office Action dated Oct. 14, 2021 in U.S. Appl. No. 16/878,443.
USPTO; Non-Final Office Action dated Oct. 4, 2021 in U.S. Appl. No. 16/886,405.
USPTO; Non-Final Office Action dated Jul. 28, 2021 in U.S. Appl. No. 16/888,423.
USPTO; Non-Final Office Action dated Oct. 13, 2021 in U.S. Appl. No. 16/893,206.
USPTO; Notice of Allowance dated Jun. 17, 2021 in U.S. Appl. No. 16/924,595.
USPTO; Non-Final Office Action dated Jul. 27, 2021 in U.S. Appl. No. 16/930,193.
USPTO; Non-Final Office Action dated Jun. 25, 2021 in U.S. Appl. No. 16/930,305.
USPTO; Non-Final Office Action dated Sep. 14, 2021 in U.S. Appl. No. 16/932,707.
USPTO; Non-Final Office Action dated Oct. 4, 2021 in U.S. Appl. No. 16/935,275.
USPTO; Notice of Allowance dated Sep. 22, 2021 in U.S. Appl. No. 16/935,280.
USPTO; Non-Final Office Action dated Aug. 23, 2021 in U.S. Appl. No. 16/938,868.
USPTO; Non-Final Office Action dated Oct. 12, 2021 in U.S. Appl. No. 16/944,763.
USPTO; Non-Final Office Action dated Aug. 19, 2021 in U.S. Appl. No. 16/992,806.
USPTO; Non-Final Office Action dated Jul. 7, 2021 in U.S. Appl. No. 16/999,065.
USPTO; Final Office Action dated Oct. 21, 2021 in U.S. Appl. No. 16/999,065.
USPTO; Final Office Action dated Jul. 23, 2021 in U.S. Appl. No. 17/009,093.
USPTO; Advisory Action dated Oct. 5, 2021 in U.S. Appl. No. 17/009,093.
USPTO; Non-Final Office Action dated Sep. 28, 2021 in U.S. Appl. No. 17/023,129.
USPTO; Notice of Allowance dated Oct. 14, 2021 in U.S. Appl. No. 17/024,092.
USPTO; Notice of Allowance dated Oct. 4, 2021 in U.S. Appl. No. 17/028,066.
USPTO; Non-Final Office Action dated Sep. 10, 2021 in U.S. Appl. No. 17/038,514.
USPTO; Non-Final Office Action dated Oct. 22, 2021 in U.S. Appl. No. 17/073,544.
USPTO; Non-Final Office Action dated Sep. 30, 2021 in U.S. Appl. No. 17/093,224.
USPTO; Non-Final Office Action dated Sep. 22, 2021 in U.S. Appl. No. 17/126,275.
USPTO; Non-Final Office Action dated Sep. 23, 2021 in U.S. Appl. No. 17/254,111.
USPTO; Non-Final Office Action dated Sep. 27, 2021 in U.S. Appl. No. 17/254,366.
USPTO; Notice of Allowance dated Jul. 1, 2021 in U.S. Appl. No. 29/679,620.
USPTO; Notice of Allowance dated Jul. 9, 2021 in U.S. Appl. No. 29/692,490.
USPTO; Non-Final Office Action dated Jul. 14, 2021 in U.S. Appl. No. 29/695,044.
USPTO; Notice of Allowance dated Jun. 8, 2021 in U.S. Appl. No. 29/696,472.
USPTO; Notice of Allowance dated Sep. 21, 2021 in U.S. Appl. No. 29/702,865.
Alen et al. "Atomic layer deposition of molybdenum nitride thin films for cu metallizations" J of The Electrochemical Society, 152(5) G361-G366 (2005).
Best et al. "Complex Halides of the Transition Metals. 24.1 Reactions of Dimeric Molybdenum (II) Halide Complexes Containing Strong Metal-Metal Bonds with Bidentate Tertiary Phosphines and Arsines" Inorganic Chemistry, vol. 17, No. 1, pp. 99-104 (1978).
Blakeney et al. "Atomic Layer Deposition of Aluminum Metal Films Using a Thermally Stable Aluminum Hydride Reducing Agent" Chem. Mater., 30, pp. 1844-1848 (2018).
Buitrago et al. "SnOx high-efficiency EUV interference lithography gratings towards the ultimate resolution in photolithography" Abstract, 1 page (2016).
Buitrago et al. "State-of-the-art EUV materials and processes for the 7 nm node and beyond" Proc of SPIE, vol. 10143, 8 pages (2017).
Cheng et al. "Improved High-Temperature Leakage in High-Density MIM Capcitors by Using a TiLaO Dielectric and an Ir Electrode" IEEE Electron Device Letters, vol. 28, No. 12, 3 pages (2007).
Firestop Support Plate, Type B, 6 In Apr. 4, 2012, Amazon. Com, May 10, 2021, https://www.amazon.com/AmeriVent-Firestop-Support-Plate-Type/dp/B007R7W951/ (2012).
Gertsch et al. "SF4 as the Fluorination Reactant for Al2O3 and VO2 Thermal Atomic Layer Etching" Chem. Mater., 31, pp. 3624-3635 (2019).
Han et al. "Synthesis and characterization of novel zinc precursors for ZnO thin film deposition by atomic layer deposition" Dalton Transactions 49.14 (2020): 4306-4314.
Hayashi et al. "2,2-Difluoro-1,3-dimethylimidazolidine (DFI). A new fluorinating agent" Chem. Commun. pp. 1618-1619 (2002).

(56) References Cited

OTHER PUBLICATIONS

Imai et al. "Energetic stability and magnetic moment of tri-, tetra-, and octa—ferromagnetic element nitrides predicted by first-principle calculations" J of Alloys and Compounds, vol. 611, 19 pages (2019).
Jacoby "Chemical deposition methods to the rescue" Cen. Acs. Org., pp. 29-32 (2018).
Jiang et al. "Sensitizer for EUV Chemically Amplified Resist: Metal versus Halogen" J of Photopolymer Science and Technology, vol. 32, No. 1, pp. 21-25 (2019).
Kang et al. "Optical Performance of Extreme Ultraviolet Lithography Mask with an Indium Tin Oxide Absorber" J of Nanoscience and Nanotechnology, vol. 12, pp. 3330-3333 (2012).
Kim et al. "Atomic layer deposition of transition metals for silicide contact formation: Growth characteristics and silicidation" Microelectronic Engineering, 106, pp. 69-75 (2013).
Lim et al. "Atomic layer deposition of transition metals" Nature Materials, vol. 2 pp. 749-754 (2003).
Maina et al. "Atomic layer deposition of transition metal films and nanostructures for electronic and catalytic applications" Critical Reviews in Solid State and Materials Sciences, Abstract, 2 pages (2020).
Miikkulainen et al. "Crystallinity of inorganic films grown by atomic layer deposition: Overview and general trends" Journal of Applied Physics, 112, 102 pages (2013).
Niskanen et al. "Radical-enhanced atomic layer deposition of metallic copper thin films" Journal of the Electrochemical Society 152(1) pp. G25-G28 (2004).
O'Hanlon "A User's Guide to Vacuum Technology" Third Edition, Chapter 19, pp. 359-378 (2003).
Ovanesyan et al. "Atomic Layer Deposition of SiCxNy Using Si2C16 and CH3NH2 Plasma" Chem. Mater. 2017, 29, pp. 6269-6278 (2017).
Park et al. "Superfilling CVD of copper using a catalytic surfactant" Proceedings of the IEEE 2001 International Interconnect Technology Conference, 3 pages (2001).
Petrov et al. "1,1,2,2-Tetrafluoroethyl-N,N-dimethylamine: a new selective fluorinating agent" J of Fluorine Chemistry, 109, pp. 25-31 (2001).
Popov et al. "Atomic Layer Deposition of PbI2 Thin Films" Chem. Mater. 31, pp. 1101-1109 (2019).
Popovici et al. "High-performance (EOT<0.4nm, Jg~10-7 A/cm2) ALD-deposited Ru\SrTiO3 stack for next generations DRAM pillar capacitor" 2018 IEEE International Electron Devices Meeting (IEDM), 4 pages (2018).
Puurunen "Surface Chemistry of Atomic Layer Depostion: A Case Study for the Trimethylaluminum/Water Process" Journal of Applied Physics, 97, 55 pages (2005).
Rahemi et al. "Variation in electron work function with temperature and its effect on the Young's modulus of metals" Scripta Materialia, 99, pp. 41-44 (2015).
SciFinder Search Results on hydrazido-based precursor for boron nitride films, search conducted Nov. 5, 2020, 5 pages (2020).
Shiba et al. "Stable yttrium oxyfluoride used in plasma process chamber" J. Vac. Sci. Technol. A, 35(2), 6 pages (2017).
Shigemoto et al. "Thermal cleaning of silicon nitride with fluorine and additive mixture" 1 page (2007).
Takaoka et al. "F-Propene-Dialkylamine Reaction Products as Fluorinating Agents" Bulletin of the Chemical Socity of Japan, vol. 52 (11), pp. 3377-3380 (1979).
Tsoutsou et al. "Atomic layer deposition of LaxZr1-xO2-d (x=0.25) high-k dielectrics for advanced gate stacks" Applied Physics Letters, 94, 3 pages (2009).
U.S. Appl. No. 60/545,181, filed Feb. 13, 2004 in the names of Matthew G. Goodman et al., and entitled "Forced Flow Susceptor with Exit Holes and Veins for Improvided Process" pp. 1-15 (2004).
U.S. Appl. No. 60/591,258, filed Jul. 26, 2004 in the names of Jeroen Stoutyesdijk et al., and entitled "Susceptor Support for Eliminating Backside Nodules" pp. 1-71 (2004).
U.S. Appl. No. 62/504,470, filed May 10, 2017 in the names of Jennifer Y. Sun et al., and entitled "Metal-Oxy-Fluoride Films for Chamber Components" pp. 1-82 (2017).
Van Asselt et al. "New Palladium Complexes of Cis-Fixed Bidentate Nitrogen Ligands as Catalysts for Carbon-Carbon Bond Formation" Organometallics, 11, pp. 1999-2001 (1992).
Van Asselt et al. "On the Mechanism of Formation of Homocoupled Products in the Carbon-Carbon Cross-Coupling Reaction Catalyzed by Palladium Complexes Containing Rigid Bidentate Nitrogen Ligands" Organometallics, 13, pp. 1972-1980 (1994).
Vayrynen et al. "Atomic Layer Deposition of Nickel Nitride Thin Films Using NiCL2 (TMPDA) and Tert-Butylhydrazine as Precursors" Phy. Status Solidi A, 216, 9 pages (2019).
Vesters et al. "Sensitizers in EUV Chemically Amplified Resist: Mechamsm of sensitivity improvement" Proc. SPIE 10583 Extreme Ultraviolet (EUV) Lithography IX, 1058307, 11 pages (2018).
Wilklow-Marnell et al. "First-row transitional-metal oxalate resists for EUV" J. Micro/Nanolith. MEMS MOEMS 17(4) Oct.-Dec. 2018, 9 pages (2018).
Zhang et al. "Mechanical Stability of Air-gap Interconnects" Proc. Future Fab International, pp. 81-87 (2008).
Zientara et al. Journal of the European Ceramic Society, 27, Abstract, 1 page (2007).
CNIPA; Office Action dated Mar. 30, 2021 in Application No. 201610131743.1.
CNIPA; Office Action dated Mar. 1, 2021 in Application No. 201710131319.1.
CNIPA; Notice of Allowance dated Mar. 30, 2021 in Application No. 201710762817.6.
CNIPA; Office Action dated Jan. 28, 2021 in Application No. 201711057557.9.
CNIPA; Office Action dated Jan. 26, 2021 in Application No. 201711057929.8.
CNIPA; Office Action dated Apr. 19, 2021 in Application No. 201711328250.8.
CNIPA; Notice of Allowance dated Apr. 7, 2021 in Application No. 201780044761.9.
CNIPA; Office Action dated Jan. 29, 2021 in Application No. 201780076230.8.
CNIPA; Office Action dated Jan. 27, 2021 in Application No. 201780076321.1.
CNIPA; Office Action dated Mar. 24, 2021 in Application No. 201880048547.5.
CNIPA; Office Action dated Dec. 22, 2020 in Application No. 201910378791.4.
CNIPA; Notice of Allowance dated Apr. 7, 2021 in Application No. 202030579755.8.
EPO; Extended European Search Report dated Apr. 6, 2021 in Application No. 21150514.4.
JPO; Notice of Allowance dated Apr. 6, 2021 in Application No. 2017-139817.
JPO; Office Action dated Mar. 31, 2021 in Application No. 2018-024655.
JPO; Notice of Allowance dated Mar. 17, 2021 in Application No. 2020-010953.
KIPO; Office Action dated Mar. 23, 2021 in Application No. 10-2014-0011765.
KIPO; Office Action dated Apr. 27, 2021 in Application No. 10-2014-0027217.
KIPO; Notice of Allowance dated Apr. 15, 2021 in Application No. 10-2014-0103853.
KIPO; Notice of Allowance dated Mar. 25, 2021 in Application No. 10-2014-0128626.
KIPO; Office Action dated Apr. 20, 2021 in Application No. 10-2014-0136089.
KIPO; Office Action dated Mar. 19, 2021 in Application No. 10-2014-0156196.
KIPO; Office Action dated Mar. 29, 2021 in Application No. 10-2014-0165685.
KIPO; Office Action dated Apr. 5, 2021 in Application No. 10-2015-0031720.
KIPO; Office Action dated Apr. 19, 2021 in Application No. 10-2015-0035094.

(56) References Cited

OTHER PUBLICATIONS

KIPO; Office Action dated Mar. 8, 2021 in Application No. 10-2017-0054647.
KIPO; Office Action dated Mar. 10, 2021 in Application No. 10-2017-0055703.
KIPO; Notice of Allowance dated May 24, 2021 in Application No. 10-2020-0101096.
KIPO; Notice of Allowance dated Apr. 1, 2021 in Application No. 30-2020-0030139 (M001).
KIPO; Notice of Allowance dated Apr. 1, 2021 in Application No. 30-2020-0030139 (M002).
TIPO; Notice of Allowance dated May 13, 2021 in Application No. 105122394.
TIPO; Notice of Allowance dated Mar. 5, 2021 in Application No. 105131284.
TIPO; Office Action dated Feb. 25, 2021 in Application No. 105134275.
TIPO; Notice of Allowance dated Mar. 4, 2021 in Application No. 106100823.
TIPO; Notice of Allowance dated May 6, 2021 in Application No. 106108522.
TIPO; Notice of Allowance dated Mar. 4, 2021 in Application No. 106111693.
TIPO; Office Action dated Feb. 25, 2021 in Application No. 106121797.
TIPO; Office Action dated Apr. 26, 2021 in Application No. 106122231.
TIPO; Office Action dated Apr. 22, 2021 in Application No. 106124126.
TIPO; Office Action dated Apr. 22, 2021 in Application No. 106124128.
TIPO; Notice of Allowance dated Mar. 25, 2021 in Application No. 106124130.
TIPO; Office Action dated Mar. 4, 2021 in Application No. 106127948.
TIPO; Office Action dated Mar. 15, 2021 in Application No. 106129971.
TIPO; Office Action dated Apr. 7, 2021 in Application No. 106135925.
TIPO; Office Action dated Apr. 7, 2021 in Application No. 106136905.
TIPO; Office Action dated Mar. 29, 2021 in Application No. 106143559.
TIPO; Office Action dated Mar. 31, 2021 in Application No. 106143570.
TIPO; Office Action dated Jan. 15, 2021 in Application No. 108142842.
TIPO; Office Action dated Jan. 25, 2021 in Application No. 108143562.
TIPO; Notice of Allowance dated May 18, 2021 in Application No. 109300595.
TIPO; Notice of Allowance dated Mar. 30, 2021 in Application No. 109305460.
USPTO; Notice of Allowance dated Feb. 10, 2021 in U.S. Appl. No. 14/219,839.
USPTO; Advisory Action dated Apr. 13, 2021 in U.S. Appl. No. 14/829,565.
USPTO; Non-Final Office Action dated May 12, 2021 in U.S. Appl. No. 14/829,565.
USPTO; Final Office Action dated Feb. 24, 2021 in U.S. Appl. No. 15/262,990.
USPTO; Advisory Action dated Apr. 28, 2021 in U.S. Appl. No. 15/262,990.
USPTO; Final Office Action dated Mar. 25, 2021 in U.S. Appl. No. 15/286,503.
USPTO; Advisory Action dated Apr. 30, 2021 in U.S. Appl. No. 15/377,439.
USPTO; Final Office Action dated Jan. 7, 2021 in U.S. Appl. No. 15/380,909.
USPTO; Non-Final Office Action dated Feb. 9, 2021 in U.S. Appl. No. 15/402,993.
USPTO; Final Office Action dated May 21, 2021 in U.S. Appl. No. 15/402,993.
USPTO; Final Office Action dated Jun. 2, 2021 in U.S. Appl. No. 15/611,707.
USPTO; Advisory Action dated Mar. 25, 2021 in U.S. Appl. No. 15/636,307.
USPTO; Non-Final Office Action dated Apr. 21, 2021 in U.S. Appl. No. 15/636,307.
USPTO; Final Office Action dated Mar. 10, 2021 in U.S. Appl. No. 15/690,017.
USPTO; Notice of Allowance dated Apr. 16, 2021 in U.S. Appl. No. 15/691,241.
USPTO; Non-Final Office Action dated Mar. 18, 2021 in U.S. Appl. No. 15/835,328.
USPTO; Notice of Allowance dated Mar. 19, 2021 in U.S. Appl. No. 15/890,037.
USPTO; Final Office Action dated Apr. 19, 2021 in U.S. Appl. No. 15/909,705.
USPTO; Non-Final Office Action dated May 20, 2021 in U.S. Appl. No. 15/917,224.
USPTO; Non-Final Office Action dated Feb. 18, 2021 in U.S. Appl. No. 15/923,834.
USPTO; Advisory Action dated Apr. 28, 2021 in U.S. Appl. No. 15/940,729.
USPTO; Notice of Allowance dated Apr. 7, 2021 in U.S. Appl. No. 15/940,759.
USPTO; Advisory Action dated Feb. 22, 2021 in U.S. Appl. No. 15/962,980.
USPTO; Final Office Action dated Apr. 13, 2021 in U.S. Appl. No. 15/967,146.
USPTO; Advisory Action dated Jun. 2, 2021 in U.S. Appl. No. 15/967,146.
USPTO; Non-Final Office Action dated Feb. 19, 2021 in U.S. Appl. No. 15/974,948.
USPTO; Non-Final Office Action dated May 25, 2021 in U.S. Appl. No. 15/985,539.
USPTO; Non-Final Office Action dated Apr. 5, 2021 in U.S. Appl. No. 15/996,286.
USPTO; Non-Final Office Action dated Feb. 4, 2021 in U.S. Appl. No. 16/000,109.
USPTO; Non-Final Office Action dated May 19, 2021 in U.S. Appl. No. 16/000,125.
USPTO; Notice of Allowance dated Feb. 5, 2021 in U.S. Appl. No. 16/000,156.
USPTO; Non-Final Office Action dated Mar. 19, 2021 in U.S. Appl. No. 16/004,041.
USPTO; Final Office Action dated Mar. 23, 2021 in U.S. Appl. No. 16/039,817.
USPTO; Advisory Action dated May 28, 2021 in U.S. Appl. No. 16/039,817.
USPTO; Final Office Action dated Mar. 8, 2021 in U.S. Appl. No. 16/042,791.
USPTO; Advisory Action dated May 14, 2021 in U.S. Appl. No. 16/042,791.
USPTO; Notice of Allowance dated Mar. 10, 2021 in U.S. Appl. No. 16/055,532.
USPTO; Final Office Action dated Mar. 23, 2021 in U.S. Appl. No. 16/105,745.
USPTO; Final Office Action dated Mar. 24, 2021 in U.S. Appl. No. 16/105,761.
USPTO; Advisory Action dated May 20, 2021 in U.S. Appl. No. 16/105,761.
USPTO; Final Office Action dated Mar. 18, 2021 in U.S. Appl. No. 16/105,802.
USPTO; Advisory Action dated May 27, 2021 in U.S. Appl. No. 16/105,802.
USPTO; Advisory Action dated Feb. 17, 2021 in U.S. Appl. No. 16/108,950.
USPTO; Non-Final Office Action dated Apr. 13, 2021 in U.S. Appl. No. 16/108,950.
USPTO; Notice of Allowance dated Mar. 23, 2021 in U.S. Appl. No. 16/116,708.
USPTO; Advisory Action dated Mar. 10, 2021 in U.S. Appl. No. 16/117,530.
USPTO; Non-Final Office Action dated Mar. 23, 2021 in U.S. Appl. No. 16/151,074.

(56) References Cited

OTHER PUBLICATIONS

USPTO; Final Office Action dated May 6, 2021 in U.S. Appl. No. 16/152,260.
USPTO; Notice of Allowance dated Feb. 24, 2021 in U.S. Appl. No. 16/167,164.
USPTO; Non-Final Office Action dated Feb. 19, 2021 in U.S. Appl. No. 16/172,535.
USPTO; Final Office Action dated May 27, 2021 in U.S. Appl. No. 16/172,535.
USPTO; Advisory Action dated Apr. 5, 2021 in U.S. Appl. No. 16/176,517.
USPTO; Notice of Allowance dated May 13, 2021 in U.S. Appl. No. 16/176,517.
USPTO; Notice of Allowance dated Feb. 19, 2021 in U.S. Appl. No. 16/183,258.
USPTO; Notice of Allowance dated Feb. 10, 2021 in U.S. Appl. No. 16/205,899.
USPTO; Non-Final Office Action dated Mar. 29, 2021 in U.S. Appl. No. 16/206,589.
USPTO; Advisory Action dated Feb. 25, 2021 in U.S. Appl. No. 16/210,922.
USPTO; Final Office Action dated Mar. 29, 2021 in U.S. Appl. No. 16/219,555.
USPTO; Non-Final Office Action dated May 2, 2021 in U.S. Appl. No. 16/240,392.
USPTO; Advisory Action dated Jan. 26, 2021 in U.S. Appl. No. 16/251,534.
USPTO; Non-Final Office Action dated Feb. 23, 2021 in U.S. Appl. No. 16/251,534.
USPTO; Non-Final Office Action dated Mar. 30, 2021 in U.S. Appl. No. 16/252,567.
USPTO; Non-Final Office Action dated Mar. 4, 2021 in U.S. Appl. No. 16/252,569.
USPTO; Non-Final Office Action dated Apr. 20, 2021 in U.S. Appl. No. 16/397,045.
USPTO; Notice of Allowance dated Mar. 10, 2021 in U.S. Appl. No. 16/400,814.
USPTO; Non-Final Office Action dated May 7, 2021 in U.S. Appl. No. 16/423,824.
USPTO; Notice of Allowance dated Apr. 28, 2021 in U.S. Appl. No. 16/453,249.
USPTO; Final Office Action dated May 20, 2021 in U.S. Appl. No. 16/468,258.
USPTO; Notice of Allowance dated Apr. 26, 2021 in U.S. Appl. No. 16/517,122.
USPTO; Non-Final Office Action dated Feb. 1, 2021 in U.S. Appl. No. 16/563,473.
USPTO; Non-Final Office Action dated May 10, 2021 in U.S. Appl. No. 16/601,593.
USPTO; Non-Final Office Action dated Feb. 24, 2021 in Application No. 16/63 7,134.
USPTO; Notice of Allowance dated Jun. 2, 2021 in U.S. Appl. No. 16/637,134.
USPTO; Notice of Allowance dated Apr. 30, 2021 in U.S. Appl. No. 16/685,787.
USPTO; Non-Final Office Action dated Apr. 5, 2021 in U.S. Appl. No. 16/704,835.
USPTO; Final Office Action dated Feb. 22, 2021 in U.S. Appl. No. 16/713,311.
USPTO; Notice of Allowance dated May 20, 2021 in U.S. Appl. No. 16/752,514.
USPTO; Notice of Allowance dated May 24, 2021 in U.S. Appl. No. 16/765,125.
USPTO; Non-Final Office Action dated Apr. 15, 2021 in U.S. Appl. No. 16/789,138.
USPTO; Notice of Allowance dated May 12, 2021 in U.S. Appl. No. 16/800,114.
USPTO; Non-Final Office Action dated Apr. 5, 2021 in U.S. Appl. No. 16/816,078.
USPTO; Non-Final Office Action dated May 19, 2021 in U.S. Appl. No. 16/828,753.
USPTO; Non-Final Office Action dated May 4, 2021 in U.S. Appl. No. 16/872,045.
USPTO; Non-Final Office Action dated May 3, 2021 in U.S. Appl. No. 16/878,443.
USPTO; Non-Final Office Action dated Dec. 31, 2020 in U.S. Appl. No. 16/924,595.
USPTO; Non-Final Office Action dated May 25, 2021 in U.S. Appl. No. 16/935,280.
USPTO; Non-Final Office Action dated Apr. 14, 2021 in U.S. Appl. No. 17/009,093.
USPTO; Ex Parte Quayle Action dated Apr. 13, 2021 in U.S. Appl. No. 29/679,620.
USPTO; Notice of Allowance dated May 19, 2021 in U.S. Appl. No. 29/702,881.
Aubin et al. "Very low temperature (450° C) selective epitaxial growth of heavily in situ boron-doped SiGe layers" Semiconductor Science and Technology, 30, 10 pages (2015).
Barnscheidt et al. "Highly boron-doped germanium layers on Si(001) grown by carbon-mediated epitaxy" Semiconductor Science and Technology, 33, 9 pages (2018).
Belyansky et al. "Low Temperature Borophosphosilicate Glass (BPSG) Process for High Aspect Ratio Gap Fill" www.electrochem.org/dl/ma/201/pdfs/0705.pdf, downloaded May 15, 2021, 1 page.
Cheremisin et al. "UV-laser modification and selective ion-beam etching of amorphous vanadium pentoxide thin films" Phys. Status Solidi A, Applications and materials science, 206 (7), pp. 1484-1487 (2009).
Dingemans et al. "Plasma-Assisted ALD for the Conformal Deposition of SiO2: Process, Material and Electronic Properties" J of the Electrochemical Society, 159(3), H277-H285 (2012).
G02-1152 "Atomic Layer Deposition of Al2O3 with Alcohol Oxidants for Impeding Substrate Oxidation" Abstract. Oct. 16, 2019 (2019).
Imamura et al. "Cyclic C4F8 and O2 plasma etching of TiO2 for high-aspect-ratio three-dimensional devices" Template for JJAP Regular Papers, Jan. 2014, pp. 29 (2014).
Kim et al. "A process for topographically selective deposition on 3D nanostructures by ion implantation" ACS Nano, 10, 4, 4451-4458 (2016).
Lee et al. "Ultraviolet light enhancement of Ta2O5 dry etch rates" J. of Vacuum Science & Technology B: Microelectronics and Nanometer Structures Processing, Measurement, and Phenomena, 18, pp. 293-295 (2000).
Musschoot et al. "Atomic layer deposition of titanium nitride from TDMAT precursor" Microelectronic Engineering, 86, pp. 72-77 (2009).
Noircler et al. "Transmission electron microscopy characterization of low temperature boron doped silicon epitaxial films" CrystEngComm, 22(33), pp. 5464-5472 (2020).
Oyama et al. "Topotactic synthesis of vanadium nitride solid foams" Journal of Materials Research vol. 8. No. 6, pp. 1450-1454 (1993).
Rimoldi et al. "Atomic Layer Deposition of Rhenium-Aluminum Oxide Thin Films and ReOx Incorporation in a Metal-Organic Framework" Applied Materials & Interfaces, 9, pp. 35067-35074 (2017).
Standard Motor Products LX249 Ignition Pick Up, Nov. 11, 2005, Amazon.com, May 10, 2021. URL: https://www.amazon.com/Standard-Motor-Products-LX249-Ignition/dp/B000C7ZTS4/ (2005).
Tao et al. "Improved performance of GeON as charge storage layer in flash memory by optimal annealing" Microelectronics Reliability, vol. 52, pp. 2597-2601 (2012).
Wirths et al. "Low temperature RPCVD epitaxial growth of Si1xGex using Si2H6 and Ge2H6" Solid-State Electronics, 88, pp. 2-9 (2013).
Yanguas-Gil et al. "Modulation of the Growth Per Cycle in Atomic Layer Deposition Using Reversible Surface Functionalization" Chemistry of Materials, 25, pp. 4849-4860 (2013).

* cited by examiner

METHODS FOR SELECTIVELY FORMING A TARGET FILM ON A SUBSTRATE COMPRISING A FIRST DIELECTRIC SURFACE AND A SECOND METALLIC SURFACE

CROSS-REFERENCE TO RELATED APPLICATIONS

This application claims priority to U.S. Patent Application Ser. No. 62/940,705 filed Nov. 26, 2019 titled METHODS FOR SELECTIVELY FORMING A TARGET FILM ON A SUBSTRATE COMPRISING A FIRST DIELECTRIC SURFACE AND A SECOND METALLIC SURFACE, the disclosures of which are hereby incorporated by reference in their entirety.

FIELD OF INVENTION

The present disclosure relates generally to methods for selectively forming a target film on a substrate comprising a first dielectric surface and a second metallic surface and particularly methods for selectively forming a target film from vapor phase reactants on a second metallic surface utilizing a selectively formed passivation film.

BACKGROUND OF THE DISCLOSURE

In some semiconductor device fabrication processes, it may be desirable to deposit a target film only on certain areas of a substrate. Typically, such discriminating results are achieved by depositing a continuous film of the target material and subsequently patterning the continuous film using lithography and etch steps. Such lithography and etch processes may be time consuming, expensive, and do not offer the precision required for many applications. A possible solution is the use of selective deposition processes, whereby a target film is deposited only in the desired areas thereby eliminating the need for subsequent patterning steps. Selective deposition processes employed for the fabrication of semiconductor device structures may take a number of forms, including, but not limited to, selective dielectric deposition on dielectric surfaces (DoD), selective dielectric deposition on metallic surfaces (DoM), selective metal deposition on dielectric surfaces (MoD), and selective metal deposition on metallic surfaces (MoM).

Selective deposition on metallic surfaces (i.e., DoM, or MoM) may be of interest for providing simplified methods for selectively depositing a target film over a metallic surface without the need for complex patterning and etch steps. A common method for forming a target film over metallic surfaces may comprise: a blanket deposition of a target film over the entire surface of the substrate, wherein the target film covers both the metallic surfaces and the dielectric surfaces; and forming a photolithography mask layer (or if required a double patterned mask layer) over the surface of the blanket film; where the mask layer is disposed over the regions where the target film is to remain. The substrate is then exposed to an etch process, such as a wet etch or a dry etch, which will remove the target film from the exposed regions of the target film not covered by the photolithographic mask. Subsequent processes may remove the remaining photolithographic mask, thereby forming a substrate comprising a target film disposed only over the metallic surfaces of the substrate. However, such processes for the formation of a target film over metallic surfaces are complex, time consuming, cost prohibitive, and will only become more complex as device feature size decreases at advanced technology nodes.

Accordingly, methods are desired for selectively forming a target film on metallic surfaces.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, methods for selectively forming a target film on a substrate comprising a first dielectric surface and a second metallic surface are provided. The methods may comprise: contacting the substrate with a plasma generated from a hydrogen containing gas; selectively forming a passivation film from vapor phase reactants on the first dielectric surface while leaving the second metallic surface free from the passivation film; and selectively depositing the target film from vapor phase reactants on the second metallic surface relative to the passivation film.

For the purpose of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

Figure 3:
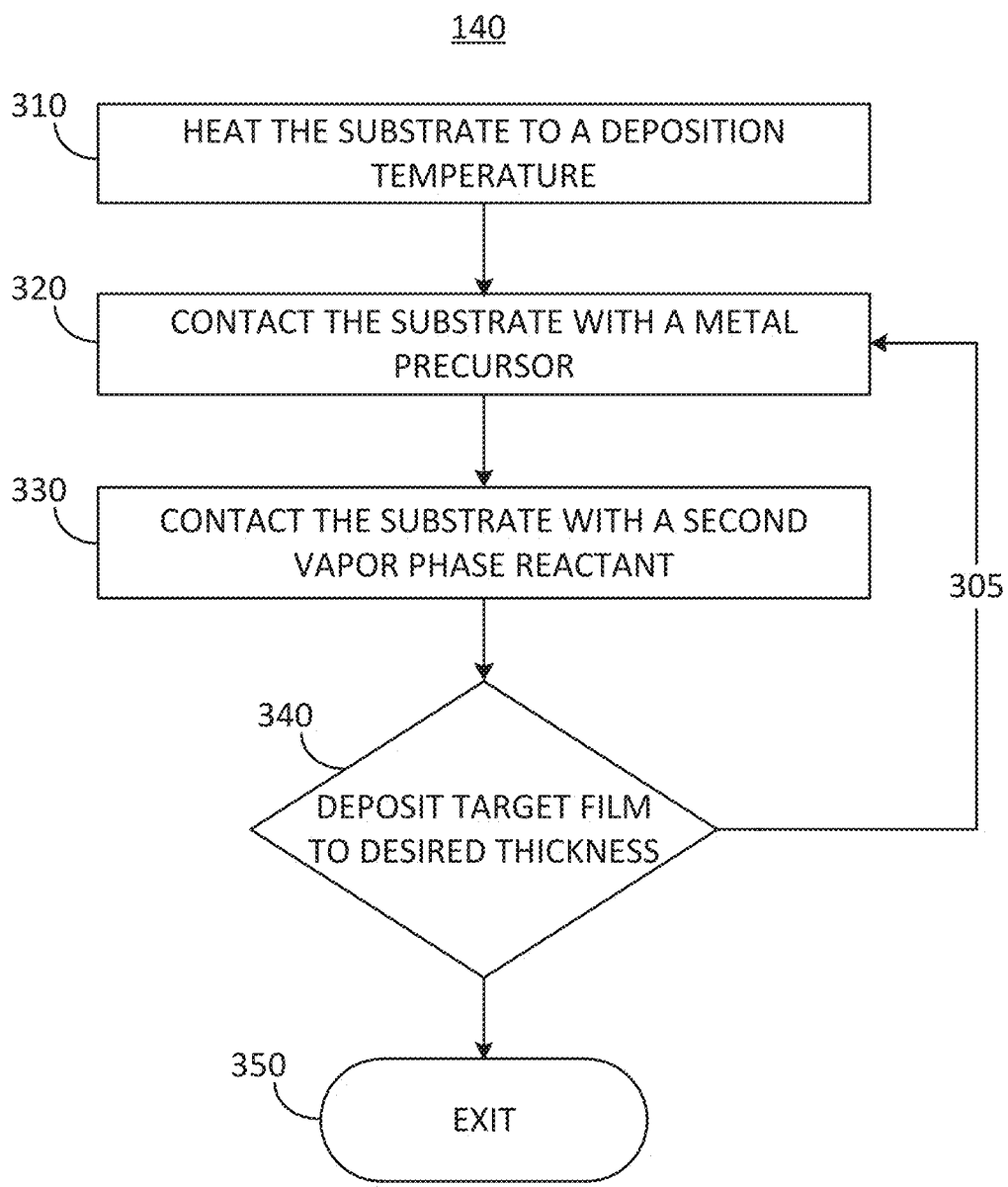

FIG. 3 illustrates an exemplary sub-process flow for selectively depositing a target film on a second metallic surface utilizing a cyclical deposition process according to the embodiments of the disclosure; and FIGS. 4A-4E illustrate exemplary cross-sectional views of semiconductor structures formed by selectively forming a target film on a substrate comprising a first dielectric surface and a second metallic surface according to the embodiments of the disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The illustrations presented herein are not meant to be actual views of any particular material, structure, or device, but are merely idealized representations that are used to describe embodiments of the disclosure.

As used herein, the term "substrate" may refer to any underlying material or materials that may be used, or upon which, a device, a circuit or a film may be formed.

As used herein, the term "metallic surface" may refer to surfaces including a metallic component, including, but not limited to, metal surfaces, metal oxide surfaces, metal silicide surfaces, metal nitride surfaces, metal carbide surfaces, and mixtures thereof. The term "metallic surface" may also include a surface of native oxide of a metallic material.

As used herein, the term "dielectric surface" may refer a surface of dielectric material, including, but not limited to, silicon containing dielectric materials, such as, for example, silicon oxides, silicon nitrides, silicon oxynitrides, silicon oxycarbides, and mixtures thereof. In addition, the term "dielectric surface" may also refer to a surface of metal oxide material, or metal nitride material.

As used herein, the term "cyclic vapor deposition" may refer to the sequential introduction of two or more precursors (reactants) into a reaction chamber to deposit a film over a substrate and includes deposition techniques such as atomic layer deposition, molecular layer deposition, and cyclical chemical vapor deposition.

As used herein, the term "cyclical chemical vapor deposition" may refer to any process wherein a substrate is sequentially exposed to two or more volatile precursors, which react and/or decompose on a substrate to produce a desired deposition.

As used herein, the term "atomic layer deposition" (ALD) may refer to a vapor deposition process in which deposition cycles, preferably a plurality of consecutive deposition cycles, are conducted in a process chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "molecular layer deposition" (MLD) may refer to a vapor deposition process in which deposition cycles, preferably a plurality of consecutive deposition cycles, are conducted in a process chamber. Typically, during each cycle an organic precursor is chemisorbed to a deposition surface (e.g., a substrate surface or a previously deposited underlying surface such as material from a previous MLD cycle), typically forming a single molecular layer that does not readily react with additional organic precursor (i.e., a self-limiting reaction). Thereafter, if necessary, another precursor (e.g., another organic precursor) may subsequently be introduced into the process chamber for use in forming the desired organic material on the deposition surface. Further, purging steps may also be utilized during each cycle to remove excess organic precursor from the process chamber and/or remove reaction byproducts from the process chamber after formation of the desired organic material.

As used herein, the term "cyclopentadienyl based metal precursor" may refer to a metal precursor comprising a metal complex with one of more cyclopentadienyl groups ($C_5H_5^-$, abbreviated as $Cp^-$).

As used herein, the term "film" may refer to any continuous or non-continuous structures and material formed or deposited by the methods disclosed herein. For example, "film" could include 2D materials, nanorods, nanotubes, nanolaminates, or nanoparticles or even partial or full molecular layers or partial or full atomic layers or clusters of atoms and/or molecules. "Films" may comprise material with pinholes, but still be at least partially physically continuous.

A number of example materials are given throughout the embodiments of the current disclosure, it should be noted that the chemical formulas given for each of the example materials should not be construed as limiting and that the non-limiting example materials given should not be limited by a given example stoichiometry.

The embodiments of the disclosure may include methods for selectively forming a target film on a substrate comprising a first dielectric surface and a second metallic surface. In particular, the embodiments of the disclosure may comprise, selectively forming a target film over a metallic surface and may include metal-on-metal selective formation processes, and dielectric-on-metal selective formation processes. The selective formation of the target film on, or directly on, a metallic surface may be permitted by initially selectively forming a passivation film on, or directly on, the first dielectric surfaces without forming a passivation film on the second metallic surfaces.

The selective formation of the passivation film on the dielectric surfaces of the substrate may be realized by initially contacting the substrate comprising both dielectric surfaces and metallic surfaces, with a plasma generated from a hydrogen containing gas. After the initial treatment of the surfaces of the substrate with the hydrogen based plasma, a selective deposition process may be utilized to selectively deposit a passivation film over the first dielectric surfaces relative to the second metallic surfaces, i.e., a greater thickness of the passivation film is deposited over the dielectric surfaces relative to the thickness of the passivation film formed over the metallic surfaces. After selective deposition of the passivation film, any portion of the passivation film deposited over the metallic surfaces may be completely removed while maintaining a substantial thickness of the passivation film deposited over the dielectric surfaces.

After selective formation of the passivation film over the dielectric surfaces, a selective deposition process may be utilized to deposit the target film on the metallic surfaces relative to the passivation film, i.e., a greater thickness of the target film is deposited on the metallic surfaces relative to the thickness of the target film deposited on the passivation film. Any unwanted target film disposed over the passivation film may be removed by an etch process. Following the selective deposition of the target film over the metallic surfaces of the substrate the remaining passivation film may be selectively removed while maintaining at least a portion of the target film disposed over the metallic surfaces.

The selective formation processes described herein may be utilized to form a target film selectively on a metallic surface without the need for additional photolithography and/or etch steps. In addition, selective formation of the passivation film may be achieved without passivation/blocking agents on the surface of substrate. The selective formation processes described herein therefore simplify semiconductor device fabrication processes by reducing the number of photolithographic mask stages and/or etch stages required. In addition, the ability to selectively form a target film on a metallic surface may enable improved device performance by eliminating the deposition of certain undesirable films on metallic surfaces.

Non-limiting example applications for the selective processes of the current disclosure may comprise, selectively forming a capping layer over a metal interconnect (e.g., selective tungsten (W) formation over a copper (Cu) line. In an additional example, the selective processes of the current disclosure may be employed in image reversal applications, such as, tone reversal of an etch mask.

Therefore the embodiments of the disclosure may provide methods for selectively forming a target film on a substrate comprising a first dielectric surface and a second metallic surface. The methods may comprise: contacting the substrate with a plasma generated from a hydrogen containing gas; selectively forming a passivation film from vapor phase reactants on the first dielectric surface while leaving the second metallic surface free from the passivation film; and selectively depositing the target film from vapor phase reactants on the second metallic surface relative to the passivation film.

The skilled artisan will appreciate that selective deposition can be fully selective or partially selective. A partially selective process can result in fully selective layer by a post-deposition etch that removes all of the deposited material from over surface B without removing the entirety of the deposited material from over surface A. Because a simple etch back process can leave a fully selective structure without the need for expensive masking processes, the selective deposition need not be fully selective in order to obtain the desired benefits.

Selectivity of deposition on surface A relative to surface B can be given as a percentage calculated by [(deposition on surface A)−(deposition on surface B)]/(deposition on the surface A). Deposition can be measured in any of a variety of ways. For example, deposition may be given as the measured thickness of the deposited material, or may be given as the measured amount of material deposited. In embodiments described herein, selective deposition of a passivation film can be conducted on a first dielectric surface (A) relative to a second metallic surface (B). Subsequently, a target film may be selectively deposited on the second metallic surface (A) relative to the passivation film (B).

In some embodiments, selectivity for the selective deposition of the passivation film on the first dielectric surface (relative to the second metallic surface) and/or selectivity of the target film on the second metallic surface (relative to the passivation film) is greater than about 10%, or greater than about 50%, or greater than about 75%, or greater than about 85%, or greater than about 90%, or greater than about 93%, or greater than about 95%, or greater than about 98%, or greater than about 99%, or even greater than about 99.5%.

In some embodiments, deposition only occurs on the first surface and does not occur on the second surface. In some embodiments, deposition on surface A of the substrate relative to surface B of the substrate is at least about 80% selective, which may be selective enough for some particular applications. In some embodiments, the deposition on the surface A of the substrate relative to surface B of the substrate is at least about 50% selective, which may be selective enough for some particular applications. In some embodiments the deposition on surface A of the substrate relative to the surface B of the substrate is at least about 10% selective, which may be selective enough for some particular applications. The skilled artisan will appreciate that a partially selective process can result in a fully selective structure by a post-deposition etch that removes all of the deposited material from over surface B without removing the entirety of the deposited material from over surface A.

In some embodiments, the passivation layer deposited on the first dielectric surface of the substrate may have a thickness less than 50 nanometers, or less than 20 nanometers, or less than 10 nanometers, or less than 5 nanometers, or less than 3 nanometers, or less than 2 nanometers, or less than 1 nanometer, while a ratio of material deposited on the first dielectric surface of the substrate relative to the second metallic surface of the substrate may be greater than or equal to 200:1, or greater than or equal to 100:1, or greater than or equal to 50:1, or greater than or equal to 25:1, or greater than or equal to 20:1, or greater than or equal to 15:1, or greater than or equal to 10:1, or greater than or equal to 5:1, or greater than or equal to 3:1, or greater than or equal to 2:1.

In some embodiments the selectivity of the selective deposition processes described herein may depend on the material compositions of the materials which define the first and/or second surface of the substrate.

Figure 1:
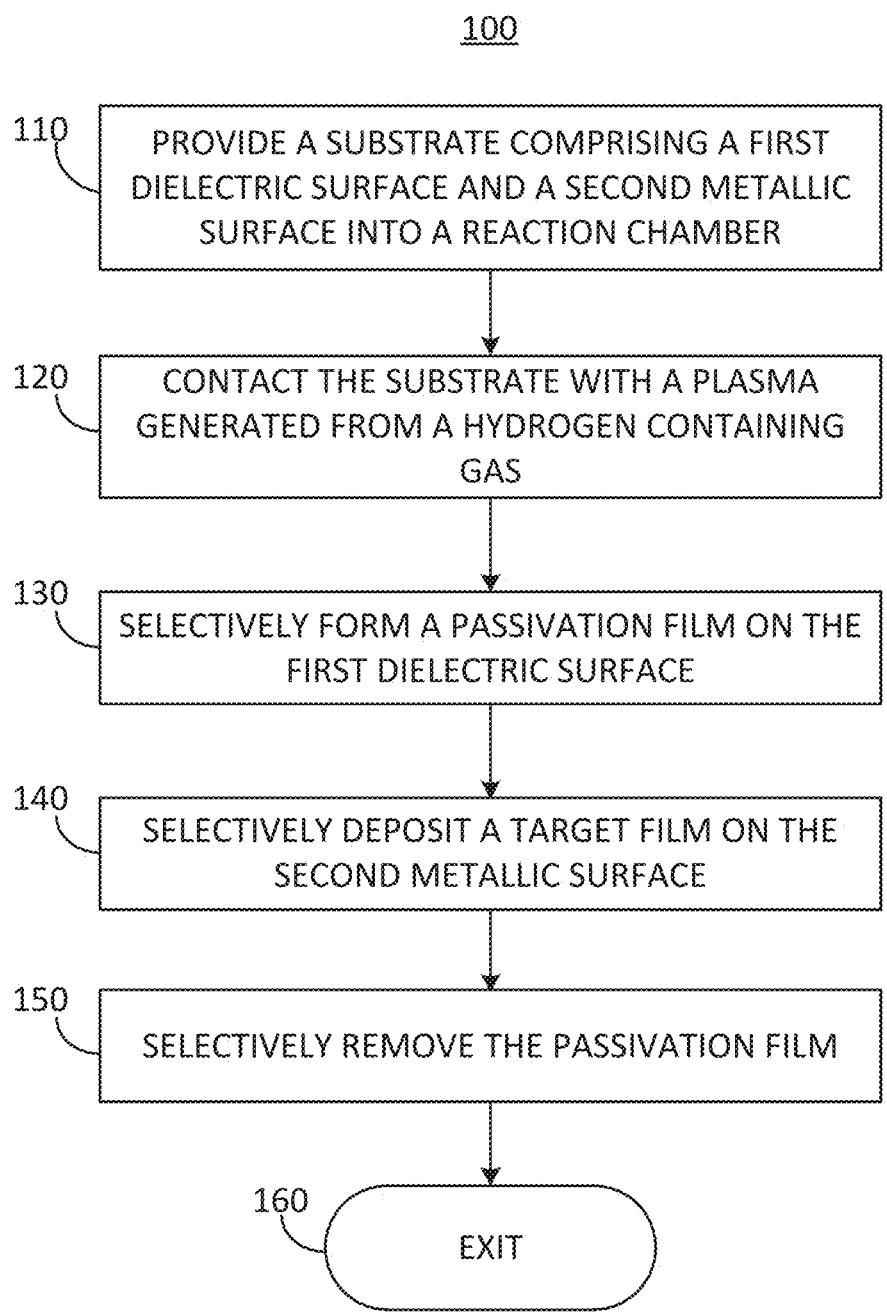
FIG. 1 illustrates an exemplary process flow for selectively forming a target film on a substrate comprising a first dielectric surface and a second metallic surface according to the embodiments of the disclosure.

The embodiments of the disclosure may be understood in greater detail with reference to FIG. 1 which illustrates exemplary process 100 for selectively forming a target film on a substrate comprising a first dielectric surface a second metallic surface. The exemplary process 100 may proceed by means of a process block 110 comprising providing a substrate comprising a first dielectric surface and a second metallic surface into a reaction chamber.

In more detail, in some embodiments of the disclosure the, substrate may comprise a planar substrate or a patterned substrate. Patterned substrates may comprise substrates that may include semiconductor device structures formed into or onto a surface of the substrate, for example, the patterned substrates may comprise partially fabricated semiconductor device structures such as transistors and/or memory elements. The substrate may comprise a first dielectric surface and a second metallic surface. In some embodiments, the surface of the substrate may comprise a plurality of first dielectric surfaces and a plurality of second metallic surfaces.

In some embodiments of the disclosure, the first dielectric surface may comprise a low dielectric constant material, i.e., a low-k material, which may be defined as an insulator with a dielectric constant less than about 4.0. In some embodiments the dielectric constant of the low-k material may less than 3.5, or less than 3.0, or less than 2.5, or even less than 2.3. In some embodiments, the first dielectric surface may comprise a first silicon containing surface. For example, the first dielectric surface may comprise at least one of a silicon oxide, a silicon nitride, a silicon carbide, a silicon oxynitride, a silicon oxycarbide, or mixtures thereof. In some embodiments of the disclosure, the first dielectric surface may comprise a porous material that contains pores which are connected to each other. In some embodiments, the first dielectric surface may comprise a metal oxide surface, or a metal nitride surface. In some embodiments, the first dielectric surface may comprise a semi-metal oxide surface, or a semi-metal nitride surface.

In some embodiments, the second metallic surface may comprise an elemental metal, such as, for example, copper (Cu), molybdenum (Mo), cobalt (Co), nickel (Ni), or tungsten (W). In some embodiments, the second metallic surface may comprise at least one of an elemental metal, a metallic oxide, a metallic nitride, a metallic silicide, a metallic carbide, or mixtures thereof. In some embodiments, the second metallic surface may comprise a native oxide of a metal containing material, such as, for example, a native oxide of copper (Cu), molybdenum (Mo), cobalt (Co), nickel (Ni), or tungsten (W). In some embodiments, the second metallic surface may comprise a transition metal. In some embodiments, the second metallic surface may comprise an oxide of a transition metal. In some embodiments, the second metallic surface may comprise a transition metal. In some embodiments, the second metallic surface may comprise transition metal, such as, for example, Cu, Co, Ni, Mo or W and may also comprises a passivation layer on top of the metal surface. For example, the transition metal may comprise one or more of titanium (Ti), vanadium (V), chromium (Cr), manganese (Mn), niobium (Nb), molybdenum (Mo), ruthenium (Ru), rhodium (Rh), palladium (Pd), silver (Ag), gold (Au), hafnium (Hf), tantalum (Ta), tungsten (W), rhenium (Re), osmium (Os), iridium (Ir), or platinum (Pt).

The exemplary selective formation process 100 may continue with the process block 110 by loading the substrate into a suitable reaction chamber. The reaction chamber may be configured for performing all, or a portion, of the remaining process blocks of selective formation process 100. In some embodiments of the disclosure, a first reaction chamber may be configured to contact the substrate with a plasma generated from a hydrogen containing gas (i.e., process block 120) and further reaction chamber(s) may be employed for the subsequent process blocks utilized in the exemplary process 100. However, in additional embodiments of the disclosure, the first reaction chamber may be configured to perform all of the process blocks comprising the selective formation deposition process 100.

Reactors and associated reaction chamber(s) capable of the selective formation of a target film on a metallic surface can be used to perform the exemplary selective formation process 100. Such reaction chambers may include atomic/molecular layer deposition (ALD/MLD) reaction chambers, plasma enhanced atomic layer deposition (PEALD) reaction chambers, as well as chemical vapor deposition (CVD) reaction chambers equipped with appropriate equipment and means for providing precursors. According to some embodiments a showerhead reaction chamber may be used. According to some embodiments a plasma reaction chamber, such as PEALD reaction chamber, may be used. In such embodiments, the plasma may be direct, remote, or in near vicinity of the substrate. In some embodiments the reactor is a spatial ALD reactor, in which the substrates moves or rotates during processing.

In some embodiments a batch reactor may be used. In some embodiments, a vertical batch reactor is utilized in which the boat rotates during processing. For example, a vertical batch reactor may comprise, a reaction chamber and an elevator constructed and arranged to move a boat configured for supporting a batch of between 10 to 200 substrates in or out of the reaction chamber.

In other embodiments, the batch reactor comprises a mini-batch reactor configured to accommodate 10 or fewer wafers, 8 or fewer wafers, 6 or fewer wafers, 4 or fewer wafers, or 2 wafers. In some embodiments in which a batch reactor is used, wafer-to-wafer non-uniformity is less than 3% (1sigma), less than 2%, less than 1% or even less than 0.5%.

The deposition processes described herein can optionally be carried out in a reactor and associated reaction chambers connected to a cluster tool. In a cluster tool, because each reaction chamber is dedicated to one type of process, the temperature of the reaction chamber in each module can be kept constant, which improves the throughput compared to a reaction chamber in which the substrate is heated up to the process temperature before each run. Additionally, in a cluster tool it is possible to reduce the time to pump the reaction space to the desired process pressure levels between substrates.

In some embodiments of the disclosure, a stand-alone reactor can be equipped with a load-lock. In that case, it is not necessary to cool down the reaction space between each run.

Once the substrate has been loaded into a suitable reaction chamber, the substrate may be heated to a suitable temperature for contacting the substrate with a plasma generated from a hydrogen containing gas. In some embodiments of the disclosure, process block 110 of exemplary selective formation process 100 may comprise heating the substrate to a temperature greater than 0° C., or greater than 100° C., or greater than 200° C., or greater than 300° C., or greater than 400° C., or even greater the 450° C. In some embodiments of the disclosure the substrate may be heated to a temperature between 20° C. and 450° C., or between 30° C. and 350° C., or between 40° C. and 300° C., or between 50° C. and 200° C., or even between 60° C. and 150° C.

The exemplary selective formation process 100 may continue by means of a process block 120 comprising contacting the substrate with a plasma generated from a hydrogen containing gas. As a non-limiting example, the substrate may be disposed within a plasma enhanced atomic layer deposition (PEALD) reaction chamber and a hydrogen based plasma may generated either within the reaction chamber or introduced into the reaction chamber and subsequently contacts the substrate.

In some embodiments of the disclosure, the hydrogen containing gas comprises at least one of hydrogen ($H_2$), or ammonia ($NH_3$).

In some embodiments, the hydrogen containing gas may be introduced into the reaction chamber at a flow rate greater than 25 sccm, or greater than 50 sccm, or greater than 100 sccm, or greater than 250 sccm, or greater than 500 sccm, or even greater than 1000 sccm. In some embodiments, the hydrogen containing gas may be introduced into the reaction chamber at a flow rate between 25 sccm and 1000 sccm.

In some embodiments, in addition to controlling the flow of the hydrogen containing gas into the reaction chamber the pressure within the reaction chamber may also be controlled to a pressure between $10e^{-6}$ Torr and 1000 Torr, or between $10e^{-5}$ Torr and 760 Torr, or between $10e^{-4}$ and 100 Torr, or even between 0.01 Torr and 50 Torr.

In some embodiments, the hydrogen containing gas is converted to a hydrogen based plasma by the application of RF power to the hydrogen containing gas. For example, the RF power applied to the hydrogen containing gas may be greater than 25 Watts, or greater than 50 Watts, or greater than 100 Watts, or greater than 250 Watts, or greater than 500 Watts, or even greater than 1000 Watts. In some embodiments of the disclosure, an RF power between approximately 25 Watts and 1000 Watts may be applied to the hydrogen containing gas to produce a hydrogen based plasma. The application of RF power to the hydrogen containing gas may produce a hydrogen based plasma comprising at least: hydrogen atoms, hydrogen ions, hydrogen radicals, and excited hydrogen species.

In some embodiments, contacting an exposed surface of the substrate with a plasma generated from a hydrogen containing gas may remove at least a portion of the —OH groups from the surface of the substrate.

In some embodiments of the disclosure, the plasma generated from a hydrogen containing gas may contact the substrate for a time period of between 0.1 seconds and 300 seconds, or between 0.2 seconds and 200 seconds, or between 0.5 seconds and 60 seconds, or even between 1 second and 30 seconds.

Methods for selectively depositing passivation films by vapor deposition techniques are disclosed in U.S. patent application Ser. No. 15/170,769, filed Jun. 1, 2016 (hereinafter "'769 application"), the entire disclosure of which is incorporated herein by reference for all purposes. The '769 application discloses the pre-treatment or clean of a substrate prior to selective deposition utilizing a hydrogen plasma and subsequently selectively depositing a passivation film on a metallic surface relative to a dielectric surface. In the embodiments of the current disclosure, the hydrogen plasma treatment may not be considered as a pre-treatment or a cleaning process but rather a selectivity reversal process. The embodiments of the current disclosure have found that the plasma treatment processes disclosed herein allows for the subsequent selective deposition of the passivation film on a dielectric surface relative to a metallic surface, i.e., the opposite selectivity to that disclosed in the '769 application.

Once the substrate has been contacted with the plasma generated from a hydrogen containing gas the exemplary selective formation process 100 may include a purge cycle to remove excess reactants and reaction byproducts from the reaction chamber. The exemplary process 100 may continue by means of a process block 130 comprising selectively forming a passivation film and particularly selectively forming a passivation film from vapor phase reactants on the first dielectric surface while leaving the second metallic surface free from the passivation film.

Figure 2:
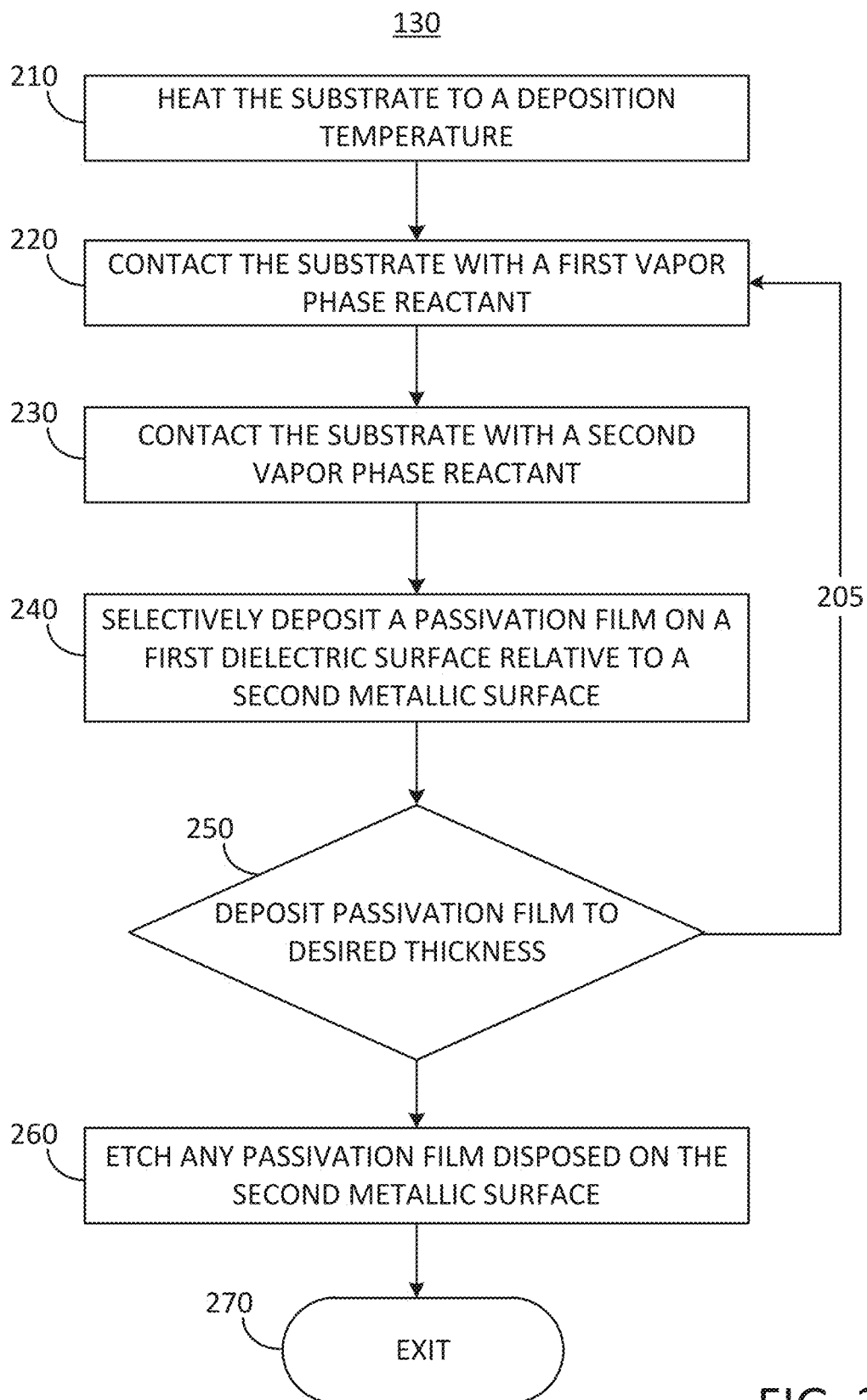
FIG. 2 illustrates an exemplary sub-process flow for selectively forming a passivation film on a first dielectric surface utilizing a cyclical deposition process according to the embodiments of the disclosure.

The process block 130 and the corresponding sub-processes are illustrated in greater detail in FIG. 2 which demonstrates an exemplary cyclical deposition process 130 for selectively depositing a passivation film on a first dielectric surface relative to a second metallic surface. The previously incorporated U.S. patent application Ser. No. 15/170,769, filed Jun. 1, 2016, describes vapor phase deposition techniques for the selective deposition of a passivation film and particular to the selective deposition of organic passivation films, such as, for example, polymers including, polyimide films, polyamide films, polyuria films, polyurethane films, polythiophene films, and more. CVD of polymer films can produce greater thickness control, mechanical flexibility, conformal coverage, and biocompatibility as compared to the application of liquid precursors. Cyclical deposition processes for depositing polymers films can produce high growth rates in suitable reaction chambers. Similar to CVD, cyclical deposition processes can produce greater thickness control, mechanical flexibility, and conformality. The terms "sequential deposition" and "cyclical deposition" are employed herein to apply to processes in which the substrate is alternately or sequentially exposed to different precursors, regardless of whether the reaction mechanisms resemble atomic layer deposition (ALD), molecular layer deposition (MLD), cyclical chemical vapor deposition (CCVD), or hybrids thereof.

The exemplary cyclical deposition process 130 (FIG. 2) may proceed by means of a process block 210 comprising heating the substrate to a deposition temperature in a suitable reaction chamber. In some embodiments, the reaction chamber utilized for the selective deposition of the passivation film may be the same as that used for the prior plasma treatment, or alternative the substrate may be transferred, under a controlled environment, from a first reaction chamber to a second reaction chamber.

The deposition temperature for selective deposition of the passivation film may differ depending upon the selected reactants and can be optimized upon selection. In some embodiments, the deposition temperature for the selective deposition of the passivation film may be less than 250° C., or less than 200° C., or less than 150° C., or less than 100° C., or less than 80° C., or even between a temperature of 80° C. and 250° C. In some embodiments, the reaction chamber pressure for selective deposition of the passivation film may be from about 1 mTorr to about 1000 Torr.

In some embodiments, the selectively formed passivation film may comprise an organic film. In such embodiments the selectively deposited organic film may comprise a polyamide film, and the deposition temperature can be selected from a range of about 80° C. to about 150° C., or greater than 80° C., or greater than 90° C., or greater than 100° C., or greater than 100° C., or greater than 110° C., or greater than 120° C., or greater than 130° C., or greater than 140° C., or even greater than 150° C. In some embodiments where the selectively deposited organic film comprises a polyimide, the deposition temperature may be greater than about 160° C., or greater than about 180° C., or greater than about 190° C., or greater than about 200° C., or greater than about 210° C., or even between approximately 160° C. and 210° C.

In some embodiments, the exemplary cyclical deposition process 130 for selective vapor deposition of an organic passivation film comprises, vaporizing a first organic precursor at a first temperature to form a first precursor vapor phase reactant. In some embodiments, the first vapor phase reactant is transported to the substrate through a gas line at a second temperature. In some embodiments, the second transportation temperature is higher than the first vaporization temperature. In some embodiments, the substrate is contacted with the first vapor phase reactant for a first exposure period at a process block 220 (FIG. 2). In some embodiments, the first vapor phase reactant, or species thereof, chemically adsorbs on the substrate in a self-saturating or self-limiting fashion. The gas line can be any conduit that transports the first vapor phase reactant from the source to the substrate. In some embodiments, the substrate may be exposed to the first vapor phase reactant at a third temperature, i.e., the deposition temperature, that is higher than the first temperature.

In some embodiments the first vapor phase reactant may contact the substrate for a time period from about 0.01 seconds to about 60 seconds, or from about 0.05 seconds to about 30 seconds, or from about 0.1 seconds to about 10 seconds, or from about 0.2 seconds to about 5 seconds. The optimum exposure period can be readily determined by the skilled artisan based on the particular circumstances. In some embodiments, where batch reactors may be used, exposure periods of greater than 60 seconds may be employed.

Excess of the first vapor phase reactant (and any volatile reaction by-products) may then be removed from contact with the substrate. Such removal can be accomplished by, for example, purging (i.e., with an inert gas), pump down, moving the substrate away from a chamber or zone in which it is exposed to the first vapor phase reactant, or combinations thereof. In some embodiments, a first vapor phase reactant removal period, for example a purge period, is from about 0.01 seconds to about 60 seconds, or from about 0.05 seconds to about 30 seconds, or from about 0.1 seconds to about 10 seconds, or from about 0.2 seconds to about 5 seconds. The optimum removal period can be readily determined by the skilled artisan based on the particular circumstances. In some embodiments, where batch reactors may be used, removal periods of greater than 60 seconds may be employed.

In some embodiments, a second organic precursor may be vaporized at a fourth temperature to form the second vapor phase reactant. In some embodiments, the second vapor phase reactant is transported to the substrate through a gas line at a fifth temperature. In some embodiments, the fifth transportation temperature is higher than the fourth vaporization temperature. In some embodiments, the substrate may be contacted with the second vapor phase reactant at a sixth temperature, i.e., the deposition temperature, that is higher than the fourth temperature. In some embodiments, the sixth temperature may be substantially the same as the third temperature at which the first vapor phase reactant contacts the substrate. In some embodiments, the substrate may be exposed to a second vapor phase reactant for a second exposure period at a process block 230. In some embodiments, the second vapor phase reactant may react with the adsorbed species of the first reactant on the substrate.

In some embodiments, the second vapor phase reactant may contact the substrate for a time period from about 0.01 seconds to about 60 seconds, or from about 0.05 seconds to about 30 seconds, or from about 0.1 seconds to about 10 seconds, or from about 0.2 seconds to about 5 seconds. The optimum exposure period can be readily determined by the skilled artisan based on the particular circumstances. In some embodiments, where batch reactors may be used, exposure periods of greater than 60 seconds may be employed.

In some embodiments, excess of the second vapor phase reactant (and any volatile reaction by-product) may be removed from contact with the substrate, such that the first vapor phase reactant and the second vapor phase reactant do not mix. In some embodiments, the cyclical deposition process for the organic passivation film does not employ plasma and/or radicals, and can be considered a thermal vapor deposition process. In some embodiments, a second vapor phase reactant removal period, for example a purge period, is from about 0.01 seconds to about 60 seconds, or from about 0.05 seconds to about 30 seconds, or from about 0.1 seconds to about 10 seconds, or from about 0.2 seconds to about 5 seconds. The optimum removal period can be readily determined by the skilled artisan based on the particular circumstances. In some embodiments, where batch reactors may be used, removal periods of greater than 60 seconds may be employed.

In a process block 240, an organic passivation film is selectively deposited on the first dielectric surface relative to the second metallic surface. The skilled artisan will appreciate that selective deposition of an organic film is the result of the above-described contacting actions rather than a separate action.

The exemplary cyclical deposition process 130 (FIG. 2) may continue via a decision gate 250, wherein the decision gate is dependent on the desired thickness of the passivation film disposed over the first dielectric surface. If the thickness of the passivation layer is less than desired then the cyclical deposition phase 205 of exemplary process 130 may return to the process block 220 and continue through an additional deposition cycle. For example, in some embodiments, the above-described contacting, removing (and/or halting supply), decision gate actions, i.e., process blocks 220, 230, and 240 as well as intervening purge cycles, may be considered a unit deposition cycle. In other words, the cyclical deposition phase 205 of exemplary process 130 may perform one or more unit deposition cycles, wherein a unit deposition cycle may comprise: contacting the substrate with a first vapor phase reactant, purging excess first vapor phase reactant and reaction by-product, contacting the substrate with a second vapor phase reactant, and purging excess second vapor phase reactant and reaction by-product.

Therefore, in some embodiments, a unit deposition cycle may be repeated one or more times until an organic passivation film of a desired thickness is selectively deposited. Such a selective deposition cycle can be repeated by a cyclical deposition phase 205 until a passivation film of sufficient thickness is left on the substrate and the deposition is complete. The selective deposition cycle can include additional acts, need not be in the same sequence nor identically performed in each repetition, and can be readily extended to more complex vapor deposition techniques. For example, a selective cyclical deposition cycle can include additional reactant supply processes, such as the supply and removal of additional reactants in each cycle or in selected cycles. Though not shown, the process may additionally comprise treating the deposited film to form a polymer (for example, UV treatment, annealing, etc.).

Various precursors can be used for the above described processes. For example, in some embodiments, the first precursor or reactant is an organic reactant such as a diamine, e.g., 1,6-diaminohexane (DAH), or any other monomer with two reactive groups. In some embodiments, the first precursor may comprise a diamine and may be vaporized to produce a first vapor phase reactant comprising a diamine vapor which is transported to the reaction chamber and contacts the substrate.

In some embodiments, the second reactant or precursor is also an organic reactant capable of reacting with adsorbed species of the first vapor phase reactant under the deposition conditions. For example, the second precursor may comprise an anhydride, such as furan-2,5-dione (maleic acid anhydride) and methods may comprise vaporizing the anhydride and transporting a second vapor phase reactant comprising the anhydride vapor to the reaction chamber and contacts the substrate. In some embodiments of the disclosure, the anhydride may comprise a dianhydride, e.g., pyromellitic dianhydride (PMDA), or any other monomer with two reactive groups which will react with the first reactant.

In some embodiments, the substrate is contacted with the first vapor phase reactant prior to being contacted with the second vapor phase reactant. Thus, in some embodiments the substrate is contacted with an amine, such as a diamine, for example 1,6-diaminohexane (DAH) prior to being contacted with another precursor. However, in some embodiments the substrate may be contacted with the second vapor phase reactant prior to being contacted with the first vapor phase reactant. Thus, in some embodiments the substrate is contacted with an anhydride, such as furan-2,5-dione (maleic acid anhydride), or more particularly, a dianhydride, e.g., pyromellitic dianhydride (PMDA) prior to being contacted with another precursor.

In some embodiments, different precursor may be used to tune the organic passivation film properties. For example, a polyimide film may be deposited using 4,4'-oxydianiline or 1,4-diaminobenzene instead of 1,6-diaminohexane to obtain a more rigid structure with more aromaticity and increased dry etch resistance.

In some embodiments, the precursors do not contain metal atoms. In some embodiments, the precursors do not contain semi-metal atoms. In some embodiments, one of the precursors comprises metal or semi-metal atoms. In some embodiments, the precursors contain carbon and hydrogen and one or more of the following elements: N, O, S, P or a halide, such as Cl or F. In some embodiments, the first precursor may comprise, for example, adipoyl chloride (AC).

In some embodiments, the precursors and their associated vapor phase reactants for use in the selective cyclical deposition processes described herein may have the general formula:

$$R^1(NH_2)_2 \quad (1)$$

wherein $R^1$ may be an aliphatic carbon chain comprising 1-5 carbon atoms, 2-5 carbon atoms, 2-4 carbon atoms, 5 or fewer carbon atoms, 4 or fewer carbon atoms, 3 or fewer carbon atoms, or 2 carbon atoms. In some embodiments, the bonds between carbon atoms in the reactant or precursor may be single bonds, double bonds, triple bonds, or some combination thereof. Thus, in some embodiments a reactant may comprise two amino groups. In some embodiments, the amino groups of a reactant may occupy one or both terminal positions on an aliphatic carbon chain. However, in some embodiments, the amino groups of a reactant may not occupy either terminal position on an aliphatic carbon chain. In some embodiments, a precursor and associated vapor phase reactant may comprise a diamine. In some embodiments, a vapor phase reactant may comprise an organic precursor selected from the group of 1,2-diaminoethane (1), 1,3-diaminopropane (1), 1,4-diaminobutane (1), 1,5-diaminopentane (1), 1,2-diaminopropane (1), 2,3-butanediamine, 2,2-dimethyl-1,3-propanediamine (1).

In some embodiments, precursors and associated vapor phase reactants for use in the selective cyclical deposition processes described herein may have the general formula:

$$R^2(COCl)_2 \quad (2)$$

wherein $R^2$ may be an aliphatic carbon chain comprising 1-3 carbon atoms, 2-3 carbon atoms, or 3 or fewer carbon atoms. In some embodiments, the bonds between carbon atoms in the reactant or precursor may be single bonds, double bonds, triple bonds, or some combination thereof. In some embodiments, a reactant may comprise a chloride. In some embodiments, a reactant may comprise a diacyl chloride. In some embodiments, a reactant may comprise an organic precursor selected from the group of: oxalyl chloride (I), malonyl chloride, and fumaryl chloride.

In some embodiments, a reactant comprises an organic precursor selected from the group of 1,4-diisocyanatobutane, or 1,4-diisocyanatobenzene. In some embodiments, a reactant comprises an organic precursor selected from the group of: terephthaloyl dichloride, alkyldioyl dichlorides, such as hexanedioyl dichloride, octanedioyl dichloride, nonanedioyl dichloride, decanedioyl dichloride, or terephthaloyl dichloride. In some embodiments, a reactant comprises an organic precursor selected from the group of 1,4-diisothiocyanatobenzene, or terephthalaldehyde. In some embodiments, a reactant being vaporized can be also a diamine, such as, for example, 1,4-diaminobenzene, decane-1,10-diamine, 4-nitrobenzene-1,3-diamine, 4,4'-oxydianiline, or ethylene diamine. In some embodiments, a reactant can be a terephthalic acid bis(2-hydroxyethyl) ester. In some embodiments, a reactant can be a carboxylic acid, for example. alkyl-, alkenyl-, alkadienyl-dicarboxylic or tricarboxylic acid, such as ethanedioic acid, propanedioic acid, butanedioic acid, pentanedioic acid or propane-1,2,3-tricarboxylic acid. In some embodiments, a reactant can be an aromatic carboxylic or dicarboxylic acid, such as benzoic acid, benzene-1,2-dicarboxylic acid, benzene-1,4-dicarboxylic acid or benzene-1,3-dicarboxylic acid. In some embodiments, a reactant may comprise one or more OH-groups bonded to a hydrocarbon. In some embodiments, a reactant can be selected from the group of diols, triols, aminophenols such as 4-aminophenol, benzene-1,4-diol or benzene-1,3,5-triol. In some embodiments, a reactant can be 8-quinolinol. In some embodiments, the reactant can comprise alkenylchlorosilanes, like alkenyltrichlorosilanes, such as 7-octenyltrichlorosilane.

In some embodiments, a reactant may have a vapor pressure greater than about 0.5 Torr, or greater than 0.1 Torr, or greater than 0.2 Torr, or greater than 0.5 Torr, or even greater than 1 Torr or greater at a temperature of about 20° C. or room temperature. In some embodiments, a reactant may have a boiling point less than about 400° C., less than 300° C., less than about 250° C., less than about 200° C., less than about 175° C., less than about 150° C., or less than about 100° C., or even between 100° C. and 400° C.

In some embodiments, the organic passivation film selectively deposited on the first dielectric surface of the substrate may have a thickness less than 50 nanometers, or less than 20 nanometers, or less than 10 nanometers, or less than 5 nanometers, or less than 3 nanometers, or less than 2 nanometers, or less than 1 nanometer, or even between approximately 1 nanometer and 50 nanometers. In some embodiments, the ratio of material deposited on the first dielectric surface relative to the second metallic surface may be greater than or equal to 200:1, or greater than or equal to 100:1, or greater than or equal to 50:1, or greater than or equal to 25:1, or greater than or equal to 20:1, or greater than or equal to 15:1, or greater than or equal to 10:1, or greater than or equal to 5:1, or greater than or equal to 3:1, or greater than or equal to 2:1.

Once the organic passivation film has been selectively deposited to a desired thickness, the exemplary selective passivation film formation process 130 may continue by means of a process block 260 comprising etching the passivation film disposed on, or directly on, the second metallic surface. In some embodiments, the etch process may remove the same amount, or thickness, of material disposed on the first dielectric surface and disposed on the second metallic surface. That is, in some embodiments, the etch rate of the organic passivation film deposited on the first dielectric surface may be substantially similar to the etch rate of the organic passivation film deposited on the second metallic surface. Due to the selective nature of the deposition processes described herein, the amount of organic material deposited on the second metallic surface of the substrate is substantially less than the amount of organic material deposited on the first dielectric surface of the substrate. Therefore, an etch process may remove the entirety of the deposited organic material on, or directly on, the second metallic surface while at least a portion of the deposited organic material may remain on, or directly on, the first dielectric surface.

In some embodiments of the disclosure, etching the passivation film disposed on the second metallic surface may be performed utilizing an oxygen containing gas or a plasma generated from an oxygen containing gas.

In some embodiments, the etch process may comprise, exposing the substrate to a plasma. In some embodiments, the plasma may be generated from an oxygen containing gas and the plasma may comprise at least, oxygen atoms, oxygen radicals, excited oxygen species, or combinations thereof. In some embodiments, the plasma may be generated from a hydrogen containing gas and the plasma may comprise at least, hydrogen atoms, hydrogen radicals, excited hydrogen species, or combinations thereof. In some embodiments, the plasma may also comprise noble gas species, such as, for example, argon (Ar) species, or helium (He) species. In some embodiments the plasma may consist essentially of noble gas species. In some instances, the plasma may comprise other species, for example nitrogen atoms, nitrogen radicals, nitrogen plasma, or combinations thereof.

In some embodiments, the etch process may comprise exposing the substrate to an etchant comprising oxygen, for example ozone ($O_3$).

In some embodiments, the substrate may be exposed to an etchant at a substrate temperature of between about 30° C. and about 500° C., or between about 100° C. and about 400° C. In some embodiments, the etchant may be supplied in one continuous pulse or may be supplied in multiple shorter pulses.

As noted above, in some embodiments, $O_3$ (e.g., $O_3/N_2$) can be used in the etch process for removal of the organic passivation film disposed over the second metallic surface. In some embodiments, the etch process may be performed at a substrate temperature of about 20° C. to about 500° C., or about 50° C. to about 300° C., or about 100° C. to about 250° C., or even about 125° C. to about 200° C.

In some embodiments, the etch process may be performed at an etch rate of about 0.05 nm/min to about 50.0 nm/min, or about 0.1 nm/min to about 5 nm/min, or even about 0.2 nm/min to about 2.5 nm/min. In some embodiments, for single wafer or small batch (e.g., 5 wafers or less) processing, a low $O_3$ concentration etch process may be used, wherein the low $O_3$ concentration etch process may be performed at 0.01 Torr to 200 Torr, or about 0.1 Torr to 100 Torr (e.g., 2 Torr). Etchant pulsing can be between 0.01 sec and 20 seconds, or between 0.05 sec and 10 sec, or between 0.1 sec and 2 seconds (e.g., 0.5 sec pulse/0.5 sec purge of $O_3$). $O_3$ flow can range from 0.01 slm to 1 slm, or from 0.01 slm to 0.250 slm. Inert (e.g., $N_2$) carrier gas flow can range from 0.1 slm to 20 slm, or from 0.5 slm to 5 slm (e.g., 1.2 slm). In some embodiments, a high $O_3$ concentration etch process may be used, wherein the high $O_3$ concentration etch process is performed at 1-100 Torr, or at 5-20 Torr (e.g., 9 Torr), with longer exposures per cycle. For example, $O_3$ exposure times can be between 0.1 sec and 20 s, or between 0.5 sec and 5 seconds (e.g., 1 sec pulse/1 sec purge of $O_3$). $O_3$ flow for such high $O_3$ concentration processes can be between 0.1 slm and 2.0 slm, or between 0.5 slm and 1.5 slm (e.g., 750 sccm), with an inert (e.g., $N_2$) dilution flow of 0.1 slm to 20 slm, or 0.5 slm to 5 slm (e.g., 1.2 slm).

Upon the completion of the etch process, i.e., the process block 260 (FIG. 2), any portion of the organic passivation film disposed over the second metallic surface is removed leaving the second metallic surface exposed, while maintaining a substantial thickness of the organic passivation film disposed over the first dielectric surface. The exemplary selective passivation film formation process 130 may then conclude by means of a process block 270 wherein the exemplary process exits.

After selectively forming the passivation film on the first dielectric surface, a method for selectively forming a target film on a substrate as illustrated by exemplary process 100 may continue by means of a process block 140 (FIG. 1) comprising selectively depositing a target film from vapor phase reactants on the second metallic surface relative to the passivation film.

In more detail, the selective deposition of the target film from vapor phase reactants on the second metallic surface relative to the passivation film may be achieved utilizing a selective cyclical deposition process, such as, for example, atomic layer deposition (ALD), cyclical chemical vapor deposition (CCVD), or hybrids thereof.

A non-limiting example embodiment of a cyclical deposition process may include atomic layer deposition (ALD), wherein ALD is based on typically self-limiting reactions, whereby sequential and alternating pulses of reactants are used to deposit about one atomic (or molecular) monolayer of material per deposition cycle. The deposition conditions and precursors are typically selected to provide self-saturating reactions, such that an absorbed layer of one reactant leaves a surface termination that is non-reactive with the gas phase reactants of the same reactants. The substrate is subsequently contacted with a different reactant that reacts with the previous termination to enable continued deposition. Thus, each cycle of alternated pulses typically leaves no more than about one monolayer of the desired material. However, as mentioned above, the skilled artisan will recognize that in one or more ALD cycles more than one monolayer of material may be deposited, for example, if some gas phase reactions occur despite the alternating nature of the process.

In an ALD process utilized for the selective deposition of a target film a unit deposition cycle may comprise: exposing the substrate to a first vapor phase reactant, removing any unreacted first reactant and reaction byproducts from the reaction chamber, and exposing the substrate to a second vapor phase reactant, followed by a second removal step.

Precursors may be separated by inert gases, such as argon (Ar) or nitrogen ($N_2$), to prevent gas-phase reactions between reactants and enable self-saturating surface reactions. In some embodiments, however, the substrate may be moved to separately contact a first vapor phase reactant and a second vapor phase reactant. Because the reactions self-saturate, strict temperature control of the substrates and precise dosage control of the precursors may not be required. However, the substrate temperature is preferably such that an incident gas species does not condense into monolayers nor decompose on the surface. Surplus chemicals and reaction byproducts, if any, are removed from the substrate surface, such as by purging the reaction chamber or by moving the substrate, before the substrate is contacted with the next reactive chemical. Undesired gaseous molecules can be effectively expelled from a reaction chamber with the help of an inert purging gas. A vacuum pump may be used to assist in the purging.

In some embodiments, the cyclical deposition process may be a hybrid ALD/CVD or a cyclical CVD process. For example, in some embodiments, the growth rate of the ALD process may be low compared with a CVD process. One approach to increase the growth rate may be that of operating at a higher substrate temperature than that typically employed in an ALD process, resulting in some portion of a chemical vapor deposition process, but still taking advantage of the sequential introduction of precursors, such a process may be referred to as cyclical CVD. In some embodiments, a cyclical CVD process may comprise the introduction of two or more precursors into the reaction chamber wherein there may be a time period of overlap between the two or more precursors in the reaction chamber resulting in both an ALD component of the deposition and a CVD component of the deposition. For example, a cyclical CVD process may comprise the continuous flow of a first precursor and the periodic pulsing of a second precursor into the reaction chamber.

An exemplary selective cyclical deposition process 140, and its constituent sub-processes, for selectively depositing a target film on a second metallic surface is illustrated with reference to FIG. 3. In more detail, the exemplary selective cyclical deposition process 140 may commence by means of a sub-process block 310 comprising loading the substrate into a suitable reaction chamber and heating the substrate to a desired deposition temperature.

In some embodiments, the reaction chamber may comprise a reaction chamber associated with an atomic layer deposition system, a plasma enhanced atomic layer deposition system, as well as chemical vapor deposition (CVD) reaction chambers equipped with appropriate equipment and means for providing precursors.

In some embodiments, the reaction chamber utilized for the selective deposition of the target film may also be utilized to contact the substrate with a plasma generated from a hydrogen containing gas, as well as for selectively forming the passivation film on the first dielectric surface. In some embodiments, separate reaction chambers may be utilized for contacting the substrate with a hydrogen based plasma, selectively forming the passivation film, and selectively depositing the target film. In embodiments wherein separate reaction chamber are utilized for the processes disclosed herein the substrate may be transported between reaction chambers under a controlled environment and the separate reaction chamber may form a single cluster tool.

In some embodiments, the sub-process block 310 (FIG. 3) may comprise, heating the substrate to a suitable deposition temperature, generally at lowered pressure within the reaction chamber. Deposition temperatures are generally maintained below the thermal decomposition temperature of the reactants but at a high enough level to avoid condensation of the reactants and provide the activation energy for the desired surface reactions. In some embodiments, the deposition temperature may be below 500° C., or below 400° C., or below 300° C., or below 200° C., or below 100° C. In some embodiments, the deposition temperature may be between 80° C. and 300° C.

In some embodiments, the reaction chamber pressure may be from about 1 mTorr to about 1000 mTorr.

Once the substrate is heated to a suitable deposition temperature and the pressure within the reaction chamber has been regulated, the exemplary selective cyclical deposition process 140 (FIG. 3) may continue by means of a sub-process block 320 comprising contacting the substrate with a first vapor phase reactant comprising a metal precursor. Selective deposition of metallic materials, such as, elemental metals and metal oxides, relative to organic materials such as the passivation films disclosed herein, can be facilitated by employing hydrophobic reactants, as disclosed in U.S. Provisional Patent Application No. 62/322,396, filed May 5, 2016 the entire disclosure of which is incorporated herein by reference for all purposes. Therefore, in some embodiments of the disclosure, the metal precursor may comprise a hydrophobic reactant comprising a metal species. For more detail regarding the possible hydrophobic reactants which can be utilized for selective deposition of a metallic film see the incorporated U.S. Provisional Patent Application No. 62/322,396.

In some embodiments of the disclosure, the metal precursor may comprise a cyclopentadienyl based metal precursor. In some embodiments, the cyclopentadienyl based metal precursor comprises a metal selected from the group comprising: platinum (Pt), hafnium (Hf), ruthenium (Ru), nickel (Ni), cobalt (Co), zirconium (Zr), rhenium (Re), niobium (Nb), or tantalum (Ta).

In some embodiment, the target film may comprise an elemental metal and the cyclopentadienyl based metal precursor may comprise: $Pt(CpMe)Me_3$, $Ru(CpEt)(dmp)$, $Ru(CpEt)(pyr)$, $Ru(CpEt)_2$, $Ni(Cp)_2$, $Ni(Chex)(Cp)$, $Co(Cp)_2$, $Co(CpMe)_2$, or $CoCp(^iPrAMD)$.

In some embodiments, the target film may comprise a metal oxide and the cyclopentadienyl based metal precursor may comprise: $Pt(CpMe)Me_3$, $Hf(Cp)(NMe_2)_3$, $Hf(Cp_2CMe_2)Me(OMe)$, $Hf(Cp_2CMe_2)Me_2$, $Hf(CpMe)(NMe_2)_3$, $Hf(CpMe)_2(mmp)Me$, $Hf(CpMe)_2(O^iPr)Me$, $Hf(CpMe)_2(OMe)Me$, $Hf(CpMe)_2Me_2$, $Ru(CpEt)_2$, $Ni(CpEt)_2$, $NiCp_2$, $Co(Cp)(CO)_2$, $Co(Cp)_2$, $Zr(Cp_2CMe_2)Me(OMe)$, $Zr(Cp_2CMe_2)Me_2$, $Zr(CpEt)(NMe_2)_3$, $Zr(CpMe)(NMe_2)_3$, $Zr(CpMe)_2Me(OMe)$, $Zr(CpMe)_2Me_2$, or $Zr(CpMe)CHT$.

In some embodiments, the target film may comprise a metal nitride and the cyclopentadienyl based metal precursor may comprise: $ZrCp_2(NMe_2)_2$, or $TaCp(N^tBu)(NEt_2)_2$.

In some embodiments of the disclosure, the metal precursor may contact the substrate for a time period between 0.01 seconds to 60 seconds, or between 0.05 seconds to 30 seconds, or between 0.1 seconds to 10 seconds, or even between 0.2 seconds to 5 seconds. The optimum contact period can be readily determined by the skilled artisan based on the particular circumstances. In some embodiments, such as when batch reactors may be used, the metal precursor may contact the substrate for a time period greater than 60 seconds.

Excess metal precursor and reaction by-product, if any, may be removed by purging the reaction chamber, for example with an inert gas, and/or by vacuum. The purge step may be carried out for time sufficient to remove substantially all of the excess metal precursor and reaction byproducts from the substrate and reaction chamber. In some embodiments, the purge is carried out for a time period between 0.1 seconds to 60 seconds, or between 0.5 seconds to 20 seconds, or between 1 second to 10 seconds. Depending on the circumstances, in some embodiments a purge of longer than 60 seconds may be carried out.

After purging the metal precursor from the reaction chamber, the exemplary selective deposition process 140 (FIG. 3) may continue by means of a sub-process block 330 comprising contacting the substrate with a second vapor phase reactant.

In more detail, the selection of the second vapor phase reactant in the sub-process block 330 is dependent on the desired target film to be selectively deposited. In some embodiments of the disclosure, the target film may comprise an elemental metal and the second vapor phase reactant may comprise a reducing agent. In some embodiments of the disclosure, the target film may comprise a metal oxide and the second vapor phase reactant may comprise an oxygen precursor. In some embodiments, the target film may comprise a metal nitride and the second vapor phase reactant may comprise a nitrogen precursor.

In embodiments wherein the target film comprises an elemental metal, the second vapor phase reactant may comprise a reducing agent selected from the group comprising: tertiary butyl hydrazine ($C_4H_{12}N_2$), hydrogen ($H_2$), a hydrogen ($H_2$) plasma, ammonia ($NH_3$), an ammonia ($NH_3$) plasma, hydrazine ($N_2H_4$), silane ($SiH_4$), disilane ($Si_2H_6$), trisilane ($Si_3H_8$), germane ($GeH_4$), digermane ($Ge_2H_6$), borane ($BH_3$), diborane ($B_2H_6$), alcohols, aldehydes, carboxylic acids, or amines.

In embodiments wherein the target film comprises a metal oxide, the second vapor phase reactant may comprise an oxygen precursor selected from the group comprising: ozone ($O_3$), molecular oxygen ($O_2$), oxygen atoms (O), an oxygen plasma, oxygen radicals, oxygen excited species, water ($H_2O$), and hydrogen peroxide ($H_2O_2$).

In embodiments wherein the target film comprises a metal nitride, the second vapor phase reactant may comprise a nitrogen precursor selected from the group comprising: molecular nitrogen ($N_2$), ammonia ($NH_3$), hydrazine ($N_2H_4$), a hydrazine derivative, or a nitrogen-based plasma. In some embodiments, the hydrazine derivative may comprise an alkyl-hydrazine including at least one of: tertbutyl-hydrazine ($C_4H_9N_2H_3$), methylhydrazine ($CH_3NHNH_2$), or dimethylhydrazine (($CH_3)_2N_2H_2$). In some embodiments, a nitrogen-based plasma may be generated by the application of RF power to a nitrogen containing gas and the nitrogen-based plasma may comprise at least, atomic nitrogen (N), nitrogen ions, nitrogen radicals, and excited species of nitrogen.

In some embodiments of the disclosure, the second vapor phase reactant may contact the substrate for a time period between 0.01 seconds to 60 seconds, or between 0.05 seconds to 30 seconds, or between 0.1 seconds to 10 seconds, or even between 0.2 seconds to 5 seconds. The optimum contact period can be readily determined by the skilled artisan based on the particular circumstances. In some embodiments, such as when batch reactors may be used, the second vapor phase reactant may contact the substrate for a time period greater than 60 seconds.

Excess second vapor phase reactant and reaction by-product, if any, may be removed be purging, for example with an inert gas, and/or by vacuum. The purge step may be carried out for time sufficient to remove substantially all of the second vapor phase reactant. In some embodiments, the purge is carried out for a time period between 0.1 seconds to 60 seconds, or between 0.5 seconds to 20 seconds, or between 1 second to 10 seconds. Depending on the circumstances, in some embodiments a purge of longer than 60 seconds may be carried out.

The exemplary selective cyclical deposition method 140 (FIG. 3) may include a cyclical deposition phase 305, wherein a unit deposition cycle of the cyclical deposition phase 305 may comprise: contacting the substrate with a first vapor phase reactant 320 (e.g., a metal precursor), purging the reaction chamber, contacting the substrate with a second vapor phase reactant 330, and again purging the reaction chamber. In some embodiments, the cyclical deposition phase 305 may be repeated one or more times, i.e., repeating a unit deposition cycle one or more times. The cyclical deposition phase 305 may further include a decision gate 340 which determines if the cyclical deposition phase 305 continues or exits via a sub-process block 350. The decision gate 340 is determined based on the thickness of the target film deposited, for example, if the thickness of the target film is insufficient for the desired device structure, then the cyclical deposition phase 305 may return to the sub-process block 320 and the processes of contacting the substrate with the metal precursor and contacting the substrate with the second vapor phase reactant 330 may be repeated one or more times. Once the target film has been deposited to a desired thickness the exemplary process 140 may exit via the sub-process block 350 and the substrate may be subjected to additional processes to complete the selective formation of the target film on the second metallic surface.

Any target film deposited on, or directly on, the passivation film may be removed by an etch back process. Because the target film is deposited selectively on the second metallic surface, any target film left over the passivation film surface will be thinner than the passivation film formed on the first dielectric surface. Accordingly, the etch back process can be controlled to remove the entirety of the target film disposed over the passivation film without removing all of the target film disposed over the second metallic surface. Repeated selective deposition and etch back processes may result in an increasing thickness of the target film on the second metallic surface with each cycle of deposition and etch. Alternatively, any target film may be removed during subsequent removal of the passivation film in a lift-off process. As is known in the art, a lift-off process removes an overlying material by undercutting with removal of an underlying material. Any target film formed on the passivation film in a short selective deposition process tends to be non-continuous, allowing access of the etchant to the underlying film to be removed. The lift-off etch need not fully remove the passivation film in order to remove all of the undesired target film disposed over the surface of the passivation film, such that either a direct etch or the lift-off method can be used to remove the target film disposed on the surface of the passivation film in a cyclical selective deposition and removal process.

The exemplary method for selectively forming a target film on a substrate (exemplar process 100 of FIG. 1) may continue by means of a process block 150 comprising selectively removing the passivation film disposed on the first dielectric surface without removing the entirety of the target film disposed on the second metallic surface. In some embodiments, the passivation film may comprise a polymer film and selectively removing the passivation film may comprise exposing the passivation film to an oxidation process. For example, the oxidation process may be performed utilizing ozone ($O_3$), or an oxygen based plasma.

In some embodiments, the selective removal of the passivation film may comprise exposing the substrate to a plasma. In some embodiments, the plasma may comprise an oxygen based plasma including: oxygen atoms, oxygen radicals, oxygen plasma, or combinations thereof. In some embodiments, the plasma may comprise a hydrogen based plasma including: hydrogen atoms, hydrogen radicals, hydrogen plasma, or combinations thereof. In some embodiments, the plasma may also comprise noble gas species, for example Ar or He species. In some embodiments the plasma may consist essentially of noble gas species. In some instances, the plasma may comprise other species, for example nitrogen atoms, nitrogen radicals, nitrogen plasma, or combinations thereof. In some embodiments, the selective removal process may comprise exposing the substrate to an etchant comprising oxygen, for example $O_3$. In some embodiments, the substrate may be exposed to an etchant at a temperature of between about 30° C. and about 500° C., preferably between about 100° C. and about 400° C. In some embodiments, the etchant may be supplied in one continuous pulse or may be supplied in multiple shorter pulses. As noted above, the passivation film removal can be used to lift-off any remaining target film disposed over the passivation film, either in a complete removal of the passivation film or in a partial removal of the passivation film in a cyclical selective deposition and removal process.

The methods of the disclosure may be further demonstrated with reference to FIGS. 4A-4E which illustrate exemplary cross-sectional views of semiconductor structures formed by selectively forming a target film on a substrate comprising a first dielectric surface and a second metallic surface according to the embodiments of the disclosure.

Figure 4A:
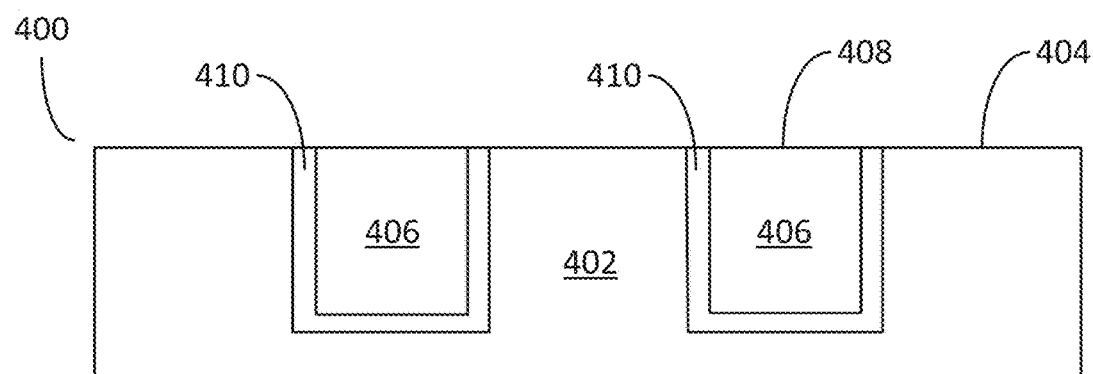

In more detail, FIG. 4A illustrates a semiconductor structure 400 which may comprise, as a non-limiting example, a portion of a partially fabricated semiconductor device including a dielectric material 402, such as, a silicon oxide. As a non-limiting example, the dielectric 402 may function as an interlayer dielectric film. In some embodiments, the dielectric material 402 comprises an exposed dielectric surface 404, such as, for example, a silicon oxide surface, a metal oxide surface, or a metal nitride surface. The semiconductor structure 400 also includes metallic features 406, such as, copper features, for example. The metallic features 406 also comprise an exposed metallic surface 408, such as, a copper surface, for example. The semiconductor structure 400 may also include metallic features 410 which may function as barrier layers to prevent the diffusion of the metallic features 406 into the surrounding dielectric material 402. As a non-limiting example, the barrier layers 410 may comprise a metallic nitride, such as, titanium nitride, for example.

The methods of the current disclosure may comprise, contacting an exposed surface of the semiconductor structure 400 with a plasma generated from a hydrogen containing gas and particular contacting the upper exposed surface comprising both a first dielectric surface 404 and a second metallic surface 408 with a plasma generated from a hydrogen containing gas. As a non-limiting example, the semiconductor structure 400 may be disposed within a reaction chamber and a hydrogen based plasma may contact the upper exposed surface of the semiconductor structure 400 for a time period of approximately 60 seconds by flowing approximately 50 sccm of hydrogen into the reaction chamber and apply an RF power of approximately 50 Watts to the hydrogen ($H_2$) gas.

Once the semiconductor structure 400 has been exposed to the hydrogen based plasma the selective formation of the target film may proceed by selectively forming a passivation film from vapor phase reactant on the first dielectric surface while leaving the second metallic surface free from the passivation surface. The selective formation of the passivation film may comprise two steps, namely the selective deposition of the passivation over the first dielectric surface relative to the second metallic surface and subsequently removing any portion of the passivation film disposed over the second metallic surface by an etch back process.

Figure 4B:
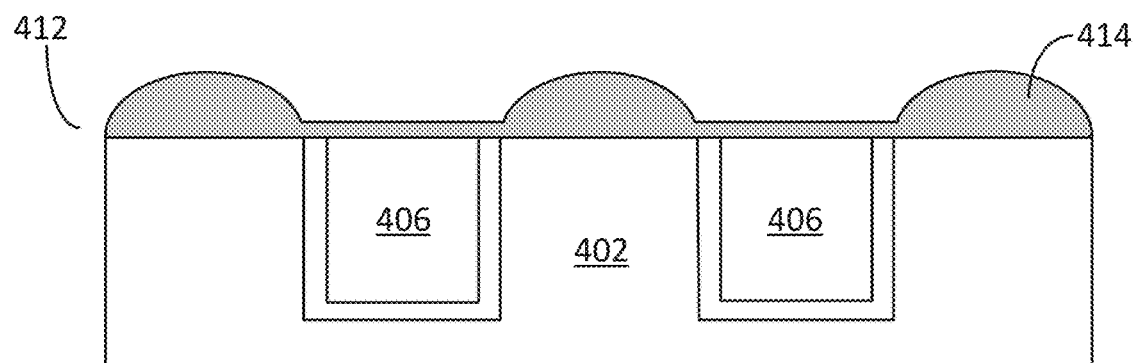

In more detail, FIG. 4B illustrates semiconductor structure 412 which comprises the semiconductor structure 400 of FIG. 4A after the selective deposition of the passivation film over the first dielectric surface 404 relative to the second metallic surface 406. As illustrated in FIG. 4B, the passivation film 414 is substantially thicker over the dielectric surfaces compared with the passivation film thickness over the metallic surfaces. As a non-limiting example, the passivation film may comprise a polyimide film deposited utilizing the cyclical deposition process described herein employing pyromellitic dianhydride (PMDA) as the first organic precursor and 1,6-diaminohexane (DAH) as the second organic precursor, wherein the substrate temperature during deposition may range from about 150° C. to about 250° C., or from about 170° C. to about 210° C., and the pressure in the reaction chamber during deposition can be regulated in a range from about 1 mTorr to about 760 Torr, or from about 100 mTorr to about 100 Torr.

Figure 4C:
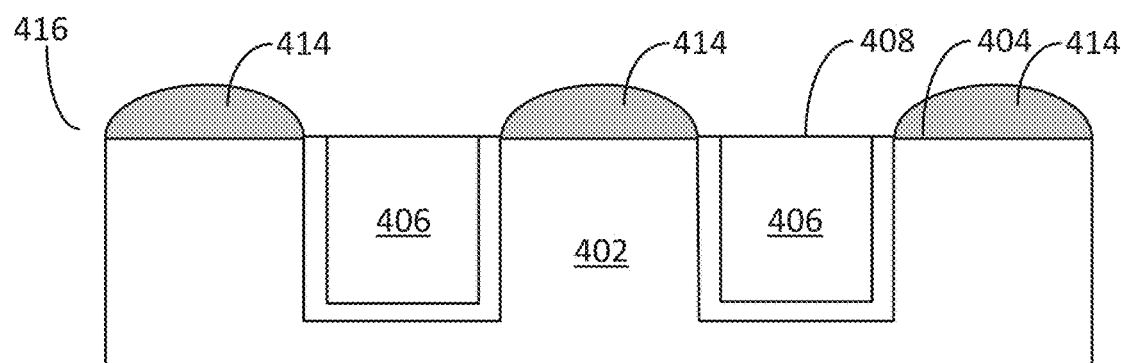

Upon completion of the selective deposition of the passivation film the methods of the disclosure may continue by, removing any portion of the passivation film deposited over the metallic surfaces utilizing an etch back process. Since the thickness of the passivation film is considerably greater over the dielectric surfaces the portion of the passivation film disposed over the metallic surfaces, resulting from a less than 100% deposition selectivity, can be completed removed while maintaining a substantial thickness of the passivation film disposed over the dielectric surfaces. For example, FIG. 4C illustrates a semiconductor structure 416 which comprises the semiconductor structure 412 (FIG. 4B) after the etch back process and demonstrates that a portion of the passivation film 414 remains disposed over the dielectric surfaces 404 while the metallic surfaces 408 are free from the passivation film, i.e., the entirety of the passivation film disposed on the metallic surfaces 408 is removed. As a non-limiting example, the etch back process may comprise exposing the passivation film to an oxygen containing etchant, such as, ozone ($O_3$), for example. The passivation film may be exposed to the ozone ($O_3$) while regulating the substrate temperature between about 30° C. and about 500° C., or between about 100° C. and about 400° C., and the ozone ($O_3$) etchant may remove the passivation film at a rate of about 0.05 nm/min to about 50 nm/min, or about 0.1 nm/min to about 5 nm/min, or about 0.2 nm/min to about 2.5 nm/min.

Figure 4D:
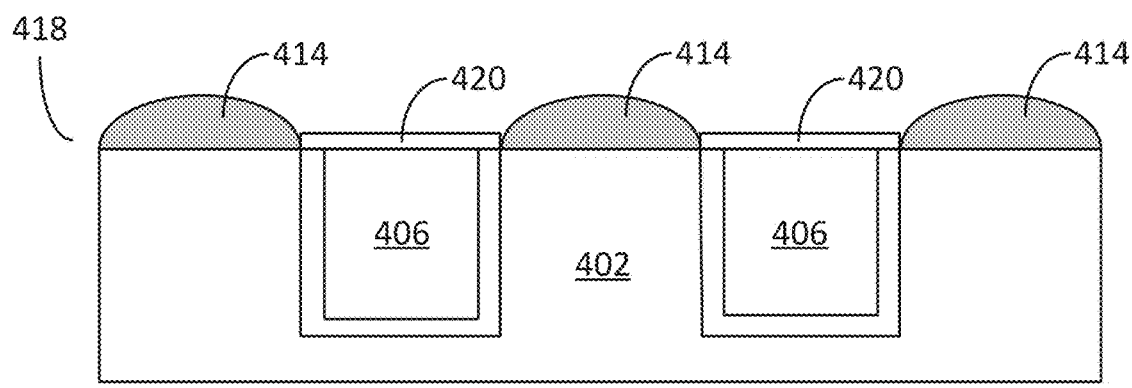

The methods of the disclosure may continue by selectively depositing a target film from vapor phase reactants on the second metallic surface relative to the passivation film. For example, FIG. 4D illustrates a semiconductor structure 418 which comprises the target film 420 disposed directly on the surface of metallic features 406 between the masking passivation film 414 disposed over the surface of dielectric material 402. As a non-limiting example, the target film 420 may comprise a zirconium oxide film deposited utilizing the cyclical deposition process described herein employing bis (methylcyclopentadienyl)methoxymethyl zirconium as the metal precursor and water ($H_2O$) as the oxygen precursor, wherein the substrate temperature during deposition may range from about 275° C. to about 325° C. and the pressure in reaction chamber during deposition can be regulated in a range from about 1 mTorr to about 760 Torr, or from about 100 mTorr to about 100 Torr.

It should be noted that structure 418 (FIG. 4D) illustrates an exemplary selective deposition of the target film 420 which is 100% selective, i.e., none of the target film is disposed over the passivation film. If the target film is deposited with less than 100% selectivity, then any target film disposed over the passivation film 414 may be removed by an etch back process or a subsequent lift-off process as previously described herein.

Figure 4E:
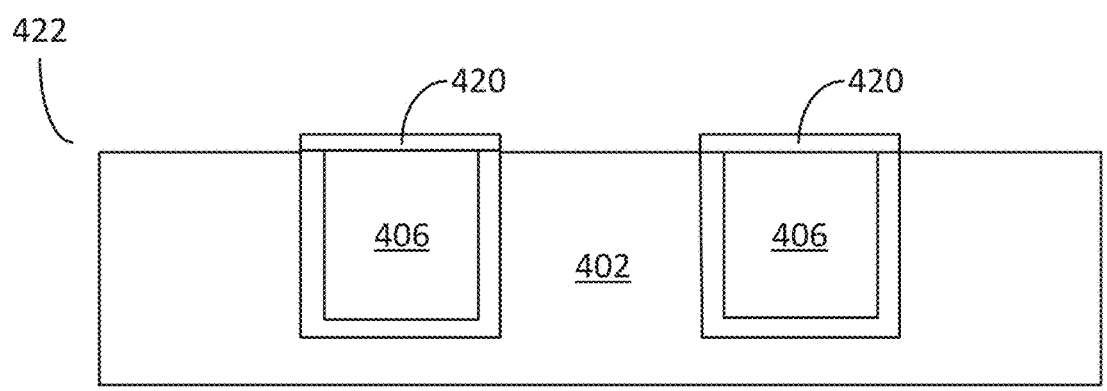

Once the target film has been deposited to a desired thickness, the remaining passivation film may be selectively removed from over the first dielectric surface without removing the entirety of the target film disposed over the metallic surfaces. For example, FIG. 4E illustrates the semiconductor structure 422 which demonstrates the semiconductor structure 418 (FIG. 4D) after the selective removal of the passivation film while maintaining a thickness of the target film disposed over the metallic surfaces. As a non-limiting example, the passivation film may be selectively removed by selectively etching the passivation film with a hydrogen based plasma generated using 100 Watts of RF power at a temperature of 300° C.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

What is claimed is:

1. A method for selectively forming a target film on a substrate comprising a first dielectric surface and a second metallic surface, the method comprising:
   contacting the substrate with a plasma generated from a hydrogen containing gas;
   selectively forming a passivation film from vapor phase reactants on the first dielectric surface while leaving the second metallic surface free from the passivation film; and
   selectively depositing the target film from vapor phase reactants on the second metallic surface relative to the passivation film,
   wherein selectively forming the passivation film comprises a cyclical deposition process.

2. The method of claim 1, wherein the hydrogen containing gas comprises at least one of hydrogen ($H_2$), or ammonia ($NH_3$).

3. The method of claim 1, wherein selectively forming the passivation film comprises, selectively vapor depositing an organic film on the first dielectric surface.

4. The method of claim 1, wherein selectively forming the passivation film further comprises etching the passivation film disposed on the second metallic surface.

5. The method of claim 1, wherein the cyclical deposition process comprises a molecular layer deposition process.

6. The method of claim 1, wherein the target film comprises: a metal oxide, a metal nitride, or an elemental metal.

7. The method of claim 1, further comprises etching any target film disposed on the passivation film post selective deposition of the target film.

8. The method of claim 1, further comprising selectively removing the passivation film disposed over the first dielectric surface without removing the entirety of the target film.

9. A semiconductor structure formed according to the method of claim 1.

10. A method for selectively forming a target film on a substrate comprising a first dielectric surface and a second metallic surface, the method comprising:
    contacting the substrate with a plasma generated from a hydrogen containing gas;
    selectively forming a passivation film from vapor phase reactants on the first dielectric surface while leaving the second metallic surface free from the passivation film; and
    selectively depositing the target film from vapor phase reactants on the second metallic surface relative to the passivation film
    wherein selectively forming the passivation film comprises, selectively vapor depositing an organic film on the first dielectric surface, and
    wherein selectively vapor depositing an organic film comprises, selectively depositing a polymer film on the first dielectric surface.

11. A method for selectively forming a target film on a substrate comprising a first dielectric surface and a second metallic surface, the method comprising:
    contacting the substrate with a plasma generated from a hydrogen containing gas;
    selectively forming a passivation film from vapor phase reactants on the first dielectric surface while leaving the second metallic surface free from the passivation film; and
    selectively depositing the target film from vapor phase reactants on the second metallic surface relative to the passivation film,
    wherein selectively forming the passivation film further comprises etching the passivation film disposed on the second metallic surface, and
    wherein etching the passivation film disposed on the second metallic surface is performed utilizing an oxygen containing gas, or a plasma generated from an oxygen containing gas.

12. A method for selectively forming a target film on a substrate comprising a first dielectric surface and a second metallic surface, the method comprising:
    contacting the substrate with a plasma generated from a hydrogen containing gas;
    selectively forming a passivation film from vapor phase reactants on the first dielectric surface while leaving the second metallic surface free from the passivation film; and
    selectively depositing the target film from vapor phase reactants on the second metallic surface relative to the passivation film,
    wherein selectively forming the passivation film further comprises etching the passivation film disposed on the second metallic surface, and
    wherein etching the passivation film disposed on the second metallic surface is performed utilizing a hydrogen based plasma.

13. A method for selectively forming a target film on a substrate comprising a first dielectric surface and a second metallic surface, the method comprising:
    contacting the substrate with a plasma generated from a hydrogen containing gas;
    selectively forming a passivation film from vapor phase reactants on the first dielectric surface while leaving the second metallic surface free from the passivation film; and
    selectively depositing the target film from vapor phase reactants on the second metallic surface relative to the passivation film,
    wherein selectively depositing the target film comprises a cyclical deposition process.

14. The method of claim 13, wherein the cyclical deposition process comprises performing one or more unit deposition cycles, wherein a unit deposition cycle comprises:

contacting the substrate with a first vapor phase reactant comprising a metal precursor; and contacting the substrate with a second vapor phase reactant.

15. The method of claim 14, wherein the second vapor phase reactant comprises: a reducing agent for the selective deposition of an elemental metal, an oxygen precursor for the selective deposition of a metal oxide, or a nitrogen precursor for the selective deposition of a metal nitride.

16. The method of claim 14, wherein the metal precursor comprises a cyclopentadienyl based metal precursor.

17. The method of claim 16, wherein the cyclopentadienyl based metal precursor comprises a metal selected from the group comprising: platinum (Pt), hafnium (Hf), ruthenium (Ru), nickel (Ni), cobalt (Co), zirconium (Zr), rhenium (Re), niobium (Nb), or tantalum (Ta).

18. A method for selectively forming a target film on a substrate comprising a first dielectric surface and a second metallic surface, the method comprising:

contacting the substrate with a plasma generated from a hydrogen containing gas;

selectively forming a passivation film from vapor phase reactants on the first dielectric surface while leaving the second metallic surface free from the passivation film;

selectively depositing the target film from vapor phase reactants on the second metallic surface relative to the passivation film; and selectively removing the passivation film disposed over the first dielectric surface without removing the entirety of the target film, wherein the passivation film comprises a polymer film and selectively removing the passivation film comprises exposing the passivation film to an oxidation process.

19. The method of claim 18, wherein the oxidation process is performed utilizing ozone ($O_3$), or an oxygen based plasma.

* * * * *